(12) United States Patent
Takatori

(10) Patent No.: US 8,248,146 B2
(45) Date of Patent: Aug. 21, 2012

(54) SEMICONDUCTOR CIRCUIT THAT VARIES A DRAIN CURRENT VALUE BY UTILIZING A DEGREE OF FREEDOM OF AN ELECTRON SPIN AND SEMICONDUCTOR DEVICE USING SAME

(75) Inventor: Kenichi Takatori, Kanagawa (JP)

(73) Assignee: NLT Technologies, Ltd., Kanagawa (JP)

( * ) Notice: Subject to any disclaimer, the term of this patent is extended or adjusted under 35 U.S.C. 154(b) by 204 days.

(21) Appl. No.: 11/889,731

(22) Filed: Aug. 15, 2007

(65) Prior Publication Data

US 2008/0061869 A1    Mar. 13, 2008

(30) Foreign Application Priority Data

Aug. 16, 2006   (JP) ................. 2006-222038

(51) Int. Cl.
*H01L 29/82* (2006.01)
*H03K 17/687* (2006.01)
(52) U.S. Cl. ......... 327/434; 327/581; 257/295; 257/421
(58) Field of Classification Search ................ None
See application file for complete search history.

(56) References Cited

U.S. PATENT DOCUMENTS

| | | | | |
|---|---|---|---|---|
| 5,654,566 A * | 8/1997 | Johnson | ......... | 257/295 |
| 7,423,327 B2 * | 9/2008 | Sugahara et al. | ......... | 257/421 |
| 7,528,428 B2 * | 5/2009 | Sugahara et al. | ......... | 257/295 |
| 2006/0043443 A1 | 3/2006 | Sugahara et al. | | |
| 2008/0061336 A1 | 3/2008 | Sugahara et al. | | |

FOREIGN PATENT DOCUMENTS

| | | |
|---|---|---|
| CN | 1685526 A | 10/2005 |
| JP | 10-032481 (A) | 2/1998 |
| JP | 2004-111904 | 4/2004 |
| JP | 2006-032915 (A) | 2/2006 |

OTHER PUBLICATIONS

Sugahara, S., and Tanaka, M.: 'A spin metal-oxide-semiconductor field-effect transistor (spin MOSFET) with a ferromagnetic semiconductor for the channel', J. Appl. Phys., 2005, 97, pp. 10D503/1-10D503/3.*

Sugahara, S., and Tanaka, M.: 'A spin metal—oxide—semiconductor field-effect transistor using half-metallic-ferromagnet contacts for the source and drain', Appl. Phys. Lett., 2004, 84, pp. 2307-2309.*

(Continued)

*Primary Examiner* — Patrick O'Neill
(74) *Attorney, Agent, or Firm* — McGinn IP Law Group, PLLC

(57) ABSTRACT

The semiconductor circuit has a power supply voltage generation circuit; a first circuit having a transistor that is connected to the power supply voltage generation circuit, and that varies a drain current value by utilizing the degree of freedom of an electron spin to vary the spin states of the source and the drain; and a main function circuit that is connected to the first circuit, and has a main function. Operation/non-operation of the main function circuit is selected by the drain current value. The operating speed of the circuit can thereby be adjusted through a simple circuit structure.

9 Claims, 17 Drawing Sheets

OTHER PUBLICATIONS

Sugahara, S., "Spin metal-oxide-semiconductor field-effect transistors (spin MOSFETs) for integrated spin electronics," Circuits, Devices and Systems, IEE Proceedings-, vol. 152, No. 4, pp. 355-365, Aug. 5, 2005.*

Sugahara, S. "Ferromagnet/semiconductor hybrid devices using epitaxial ferromagnetic tunnel junctions—Creation of group IV ferromagnetic semiconductors and application thereof to spin devices," Japan Science and Technology Agency: Promoting basic research in prioritized research fields—Individual Research (aka: "sakigake") First Class: Results Report (pp. 48-50, Figs. 5 and 6); Published Aug. 1, 2005.

Sugahara, S., Tanaka, M. "Spin MOSFET and it's applications," The 134th Topical Symposium of the Magnetics Society of Japan, The 22nd Symposium of the Magnetic Artificial Structured Thing Film, Physical Properties and Functions Joint Seminar "Present and future of spin electronics," (pp. 93-100); Published Jan. 29, 2004.

Chinese Office Action dated Nov. 6, 2009 with English translation thereof.

Satoshi Sugahara, "Spin MOSFETs as a basis for integrated spin-electronics," Proceeding of 2005 5th IEEE Conference on Nanotechnology, p. 142-145, Jul. 31, 2005.

Japanese Office Action dated May 22, 2012, with partial English-language translation.

* cited by examiner

RELATED ART

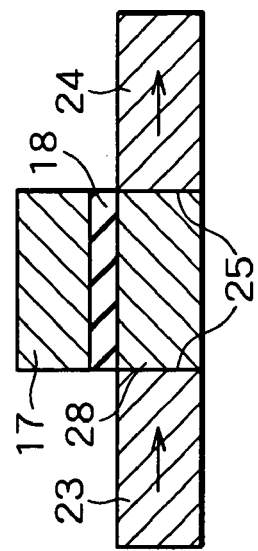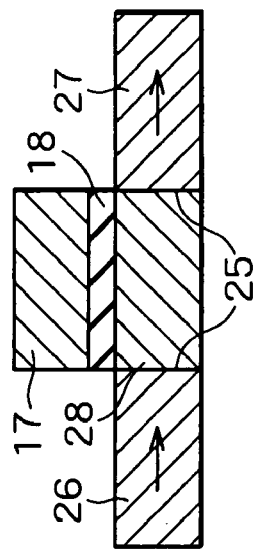
FIG. 12D  FIG. 12E
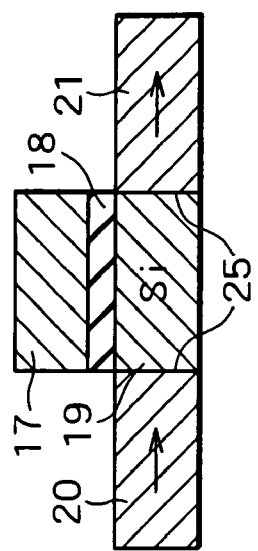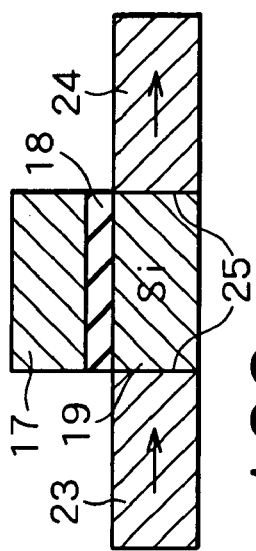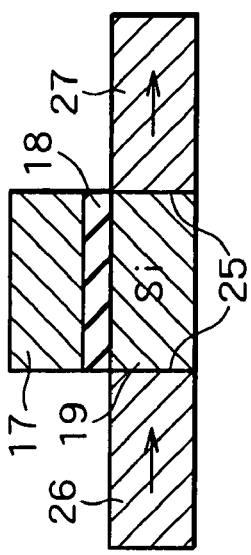
FIG. 12A  FIG. 12B  FIG. 12C

SEMICONDUCTOR CIRCUIT THAT VARIES A DRAIN CURRENT VALUE BY UTILIZING A DEGREE OF FREEDOM OF AN ELECTRON SPIN AND SEMICONDUCTOR DEVICE USING SAME

BACKGROUND OF THE INVENTION

1. Field of the Invention

The present invention relates to a semiconductor circuit that uses a field-effect transistor having spin-dependent transport characteristics, and to a semiconductor device that uses the semiconductor circuit.

2. Description of the Related Art

The development of smaller semiconductor elements in recent years has been accompanied by the problem of increased power consumption due to leak currents that flow through transistors when semiconductor circuits are not operating (during standby). Several circuit techniques have been developed and implemented as measures for addressing this increase in leak currents. Unlike conventional techniques that are aimed at increasing speed merely by reducing the power supply voltage $V_{DD}$ and the threshold voltage $V_{TH}$ of the transistors, these circuit techniques more actively control the power supply voltage $V_{DD}$ and the threshold voltage $V_{TH}$.

The conventional techniques are described in Japanese Laid-open Patent Application No. 2004-111904 (FIG. 17); Sugahara, S. "Ferromagnet/semiconductor hybrid devices using epitaxial ferromagnetic tunnel junctions-Creation of group IV ferromagnetic semiconductors and application thereof to spin devices," Japan Science and Technology Agency: Promoting basic research in prioritized research fields-Individual Research (aka: "sakigake") First Class: Results Report (pp. 48-50, FIGS. 5 and 6); and Sugahara, S., Tanaka, M. "Spin MOSFET and its applications," The 134th Topical Symposium of the Magnetics Society of Japan, The 22th Symposium of the Magnetic Artificial Structured Thin Film, Physical Properties and Functions Joint Seminar "Present and future of spin electronics," (pp. 93-100); and other publications.

Specifically, a technique for cutting off electrical power to a circuit that is not in use during a standby state using a plurality of transistors having a plurality of different power supply voltages and threshold voltages is cited as an example of a technique for more actively controlling the power supply voltage $V_{DD}$ and the threshold voltage $V_{TH}$.

Other examples include a technique for dynamically varying the threshold voltage $V_{TH}$ of a transistor by adjusting the bias voltage applied to a silicon substrate; a technique for dynamically adjusting the power supply voltage $V_{DD}$ during circuit operation; and other techniques. The $V_{DD}$-hopping technique and other techniques are known as examples of techniques for switching a plurality of power supply voltages during circuit operation.

The threshold voltage $V_{TH}$ of a unipolar transistor (Field-Effect Transistor: FET) is considered to be the gate-source voltage $V_{GS}$ when the drain current $I_D$ rapidly increases. There are various methods for extracting the threshold voltage $V_{TH}$, and these methods conceptually have a relationship such as the one shown in FIG. 1.

Examples of techniques for cutting off electrical power to an unused circuit during a standby state using a plurality of transistors that have different threshold voltages include techniques that use an MTCMOS (Multi-Threshold Voltage CMOS (Complementary Metal Oxide Semiconductor)) and a power gate (power gating). Specifically, a power switch (power switch) is provided to a circuit that has a low threshold voltage, and the power supply to the unused circuit is cut by switching the power switch during standby, and leak currents are thereby reduced. A two-input NAND gate will be used to describe an example. FIG. 2A shows a gate-level circuit symbol of a two-input NAND gate to which a power switch is not provided, and FIG. 2B is a circuit diagram showing the gate shown in FIG. 2A at the transistor level. FIG. 3A shows a gate-level circuit symbol of a two-input NAND gate to which a power switch is provided, and FIG. 3B is a circuit diagram showing the gate shown in FIG. 3A at the transistor level.

In the two-input NAND gate shown in FIGS. 2A and 2B, the use of a transistor having a high threshold voltage $V_{TH}$ is assumed, and a NAND circuit 215 having a high threshold voltage (high $V_{TH}$) is formed using an NMOS transistor 211 having a high threshold voltage (high threshold voltage $V_{TH}$) and a PMOS transistor 212 having a high threshold voltage (high $V_{TH}$). Two inputs A and B are used in the NAND circuit 215, and the output is indicated by the letter Z.

In the two-input NAND gate shown in FIGS. 3A and 3B, the use of a transistor having a low threshold voltage $V_{TH}$ is basically assumed, and a NAND circuit 216 having a low threshold voltage (low $V_{TH}$) is formed using an NMOS transistor 213 having a low threshold voltage (low threshold voltage $V_{TH}$) and a PMOS transistor 214 having a low threshold voltage (low $V_{TH}$). The NMOS transistor 211 having a high threshold voltage (high $V_{TH}$) is used as the power switch.

In the high-$V_{TH}$ NAND circuit 215 shown in FIG. 2, leak currents are extremely minimal and do not pose a practical problem. However, when each transistor is changed to a low-$V_{TH}$ transistor without modifying the structure of the NAND circuit 215 shown in FIG. 2B, leak currents increase to a level that is problematic to implementation.

In the low-$V_{TH}$ NAND gate having a power switch as shown in FIG. 3, the high-$V_{TH}$ power switch (NMOS transistor 211) is turned on during normal operation, the power switch (NMOS transistor 211) is turned off during standby, and leak currents can thereby be cut off during standby. In the circuit design, the entire circuit is first designed using the high-$V_{TH}$ NAND circuit 215 shown in FIG. 3B. The critical path of the circuit is then determined, and the gate on the critical path is converted to the low-$V_{TH}$ NAND circuit 216 that is capable of high-speed operation. A low-$V_{TH}$ NAND gate having a power switch such as the one shown in FIG. 3 is used at this conversion. During normal operation of the circuit, the power switch (NMOS transistor 211) is turned on to allow high-speed operation, and the power switch (NMOS transistor 211) is turned off during standby, whereby leak currents during standby are reduced.

In the same manner as the example described using the two-input NAND gate, a power switch of the same type as the power switch (NMOS transistor 211) provided on the ground (GND) side is provided also to the power supply voltage $V_{DD}$, whereby the power supply to the unused circuit block can be cut off during standby, thereby enabling a reduction in leak currents during standby.

A technique that uses a scheme (substrate bias scheme) for adjusting a bias voltage (substrate bias voltage) applied to the silicon substrate of the transistor is cited as an example of a technique for dynamically controlling the threshold voltage $V_{TH}$ of a transistor during normal operation of the circuit. This technique takes advantage of the fact that the threshold voltage $V_{TH}$ is varied when a bias voltage is applied to the silicon substrate of a transistor. The silicon substrate of the transistor is normally connected to the GND, but in the substrate bias scheme, the silicon substrate of the transistor is not connected to the GND, and a potential is applied to the silicon substrate to adjust the threshold voltage $V_{TH}$ of the transistor.

When the substrate bias voltage is increased, the potential difference between the silicon substrate and the drain-source decreases, and the width of the depletion layer under the channel decreases. The value is therefore close to the on state of the transistor, and the threshold voltage $V_{TH}$ of the transistor decreases. A scheme in which a positive voltage (in the case of an NMOS; negative voltage in a PMOS) is applied as the substrate bias voltage to reduce the threshold voltage $V_{TH}$ of the transistor is referred to as a forward bias scheme. Conversely, since the width of the depletion layer under the channel increases when the substrate bias voltage is reduced, the value is therefore close to the off state of the transistor, and the threshold voltage $V_{TH}$ of the transistor increases. A scheme in which a negative voltage (in the case of an NMOS; positive voltage in a PMOS) is applied as the substrate bias voltage to increase the threshold voltage $V_{TH}$ of the transistor is referred to as a back bias scheme.

Leak currents can be prevented from increasing during standby through the dynamic application of the substrate bias schemes described above. For example, leak currents can be significantly reduced by increasing the threshold voltage $V_{TH}$ of the transistor during standby. Furthermore, leak currents during normal operation of the circuit can also be reduced by constantly varying the threshold voltage $V_{TH}$ of the transistor according to the processing load of the circuit, temperature increases, and other conditions.

Leak currents can also be reduced by dynamically controlling the power supply voltage $V_{DD}$ in the same manner as the threshold voltage $V_{TH}$ of the transistor. Leak currents can be reduced by using a plurality of power supply voltages $V_{DD}$ according to the circuit, and dynamically controlling the power supply voltages $V_{DD}$, and particularly by dynamically reducing the power supply voltage $V_{DD}$ of a circuit that has a low load.

As described above, various measures have been developed for addressing increased power consumption due to increases in leak currents and the like, which are caused by reduced size of semiconductor elements, reduced power supply voltages $V_{DD}$, and other effects.

However, such problems as those described below are apparent in the schemes for suppressing an increase in power consumption by suppressing an increase in leak currents that flow through transistors during standby according to the conventional techniques described above.

First, in the scheme whereby power switches are used so that a power switch is turned on for high-speed operation during normal operation of the circuit, and the power switch is turned off during standby so as to reduce leak currents during standby, since the circuit is blocked from the power supply voltage during standby, a node that is suspended in the circuit appears and the voltage thereof has a different value than the voltage during normal operation of the circuit. Problems therefore occur in that time is required to return from the standby state to the normal operating state.

Schemes that use a power switch also include a scheme for fixing a blocked power line at another power supply potential. In this scheme, the abovementioned node that is suspended in the circuit is unlikely to occur. However, the newly fixed power supply potential is normally set to the same potential as a power supply potential in the reverse polarity in order to reduce the leak current. For example, using FIG. 3B as an example, the high-$V_{TH}$ NMOS transistor 211 is blocked, and the potential between the NMOS transistors 211 and 213 is the same as the power supply potential shown at the top of FIG. 3B. When the voltage is set in this manner, time is required to return the newly fixed power supply potential to the original power supply potential during the return to the normal operating state. Problems also occur in that a large change in potential is also necessary, and large leak currents flow during the switch from standby to normal operation.

In order to overcome these problems, a scheme referred to as ZSCCMOS (Zigzag Super Cut-off CMOS) or the like has been proposed for switching the power supply potential blocked for each adjacent gate to positive or negative to speed the return from the standby state to the normal operating state. However, this scheme has problems in that an extremely large number of power supply potentials are needed.

Second, in the scheme whereby power switches are used so that a power switch is turned on for high-speed operation during normal operation of the circuit, and the power switch is turned off during standby so as to reduce leak currents during standby, since blocking the power supply has the effect of reducing leak currents during standby, leak currents cannot be reduced in circuit blocks or gates in which the power supply cannot be blocked during standby.

Third, when an excessive negative voltage is applied in the substrate bias scheme of a back bias scheme, the $V_{TH}$ is increased by the application of the negative voltage. Therefore, a state similar to the state that occurs when a negative voltage is applied occurs even when a voltage is not applied to the gate, a leak current occurs at the joint between the drain and the substrate, and a joint leak current component referred to as GIDL (Gate Induced Drain Leakage) increases. This GIDL increases particularly as transistors are reduced in size, and leak-current-reducing effects are impossible to obtain. There is therefore almost no reduction in leak currents even when the substrate bias is optimized.

Fourth, as miniaturization progresses and the gate length decreases, short channel effects also occur with respect to the substrate bias effects, and the change in the $V_{TH}$ is therefore extremely small even when a substrate bias is applied.

Fifth, when an excessive positive voltage is applied in the substrate bias scheme of a forward bias scheme, latch-up occurs, and failure and the like sometimes occur. The reason for this is that the transistor is forced on and is caused to operate as a bipolar transistor.

Sixth, since the oxide film thickness, the amount of doping, and the type of gate electrode must be varied in order to implement a plurality of threshold voltages in a scheme that uses a plurality of transistors having different threshold voltages, a significant process burden is involved. The circuit structure also becomes complex when there is a plurality of threshold voltages, and the circuit also becomes difficult to design.

Seventh, the reduction in power consumption is limited even in a combination of the various conventional low-power schemes described above, a scheme referred to as clock gating for stopping the clock supply to an unused circuit block, and other conventional known low-power schemes. Furthermore, the reduction in power consumption is limited even when these techniques are used in combination with a DVS (Dynamic Voltage Scaling) technique for adaptively varying the power supply voltage and the operating frequency according to load. Particularly as size reduction progresses, adequate effects are not obtained merely by combining the measures described above. The development of a new technique is therefore essential.

SUMMARY OF THE INVENTION

An object of the present invention is to provide a semiconductor circuit in which the operating speed of the circuit can be adjusted by a simple circuit structure, and to provide a semiconductor device that uses the semiconductor circuit.

The semiconductor circuit of the present invention comprises a power supply voltage generation circuit; a first circuit having a transistor that is connected to the power supply voltage generation circuit, and that varies a drain current value by utilizing the degree of freedom of an electron spin to vary the spin states of the source and the drain; and a main function circuit that is connected to the first circuit, and has a main function; wherein the semiconductor circuit varies the operating speed of the main function circuit according to the drain current value.

The power consumption of the main function circuit is preferably varied according to the drain current value.

The source and drain of the transistor are preferably composed of a ferromagnetic metal or a half-metallic ferromagnet, and the channel region is preferably composed of a ferromagnetic semiconductor.

Another semiconductor circuit of the present invention comprises a power supply voltage generation circuit; a second circuit having a transistor that is connected to the power supply voltage generation circuit, and that is capable of providing a threshold value at which a drain current flows to a drain-source voltage by utilizing the degree of freedom of an electron spin to vary the spin states of the source and the drain; and a main function circuit that is connected to the second circuit, and has a main function; wherein the main function circuit does not operate when the drain-source voltage is equal to or less than the threshold value, and the gate voltage is equal to or less than the threshold value.

Another semiconductor circuit of the present invention comprises a power supply voltage line; a second circuit having a transistor that is connected to the power supply voltage line, and that is capable of providing a threshold value at which a drain current flows to a drain-source voltage by utilizing the degree of freedom of an electron spin to vary the spin states of the source and the drain; and a main function circuit that is connected to the second circuit, and has a main function; wherein the semiconductor circuit varies the voltage applied to the main function circuit according to the spin states of the transistor.

The source and drain of the transistor are preferably composed of a ferromagnetic metal or a half-metallic ferromagnet, and the channel region is preferably composed of a semiconductor.

The spin states of the source and drain of the transistor may also be dynamically adjusted.

The semiconductor device of the present invention uses the abovementioned semiconductor circuit.

According to the present invention, the operating speed of the main function circuit can be adjusted by adjusting the electron spin states of the source region and the drain region of the transistor.

Furthermore, a semiconductor circuit that has both low power consumption and high performance can be obtained by dynamically adjusting the electron spin states of the source region and the drain region of the transistor.

BRIEF DESCRIPTION OF THE DRAWINGS

FIGS. 12A through 12E are schematic diagrams showing examples of the structure of a spin MOSFET;

DESCRIPTION OF THE PREFERRED EMBODIMENTS

Figure 9:
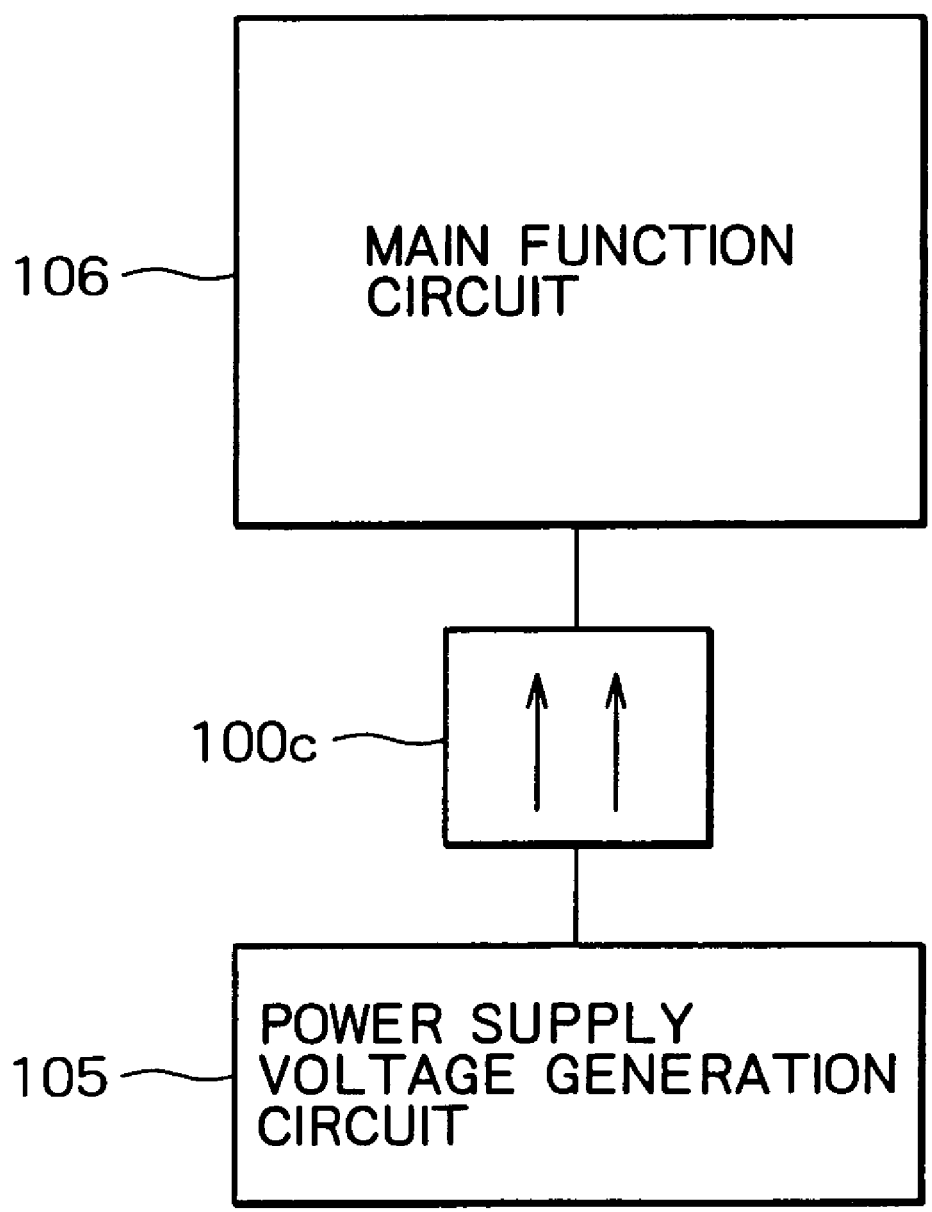
FIG. 9 is a schematic diagram showing the semiconductor circuit according to Embodiment 1 of the present invention.
Figure 10:
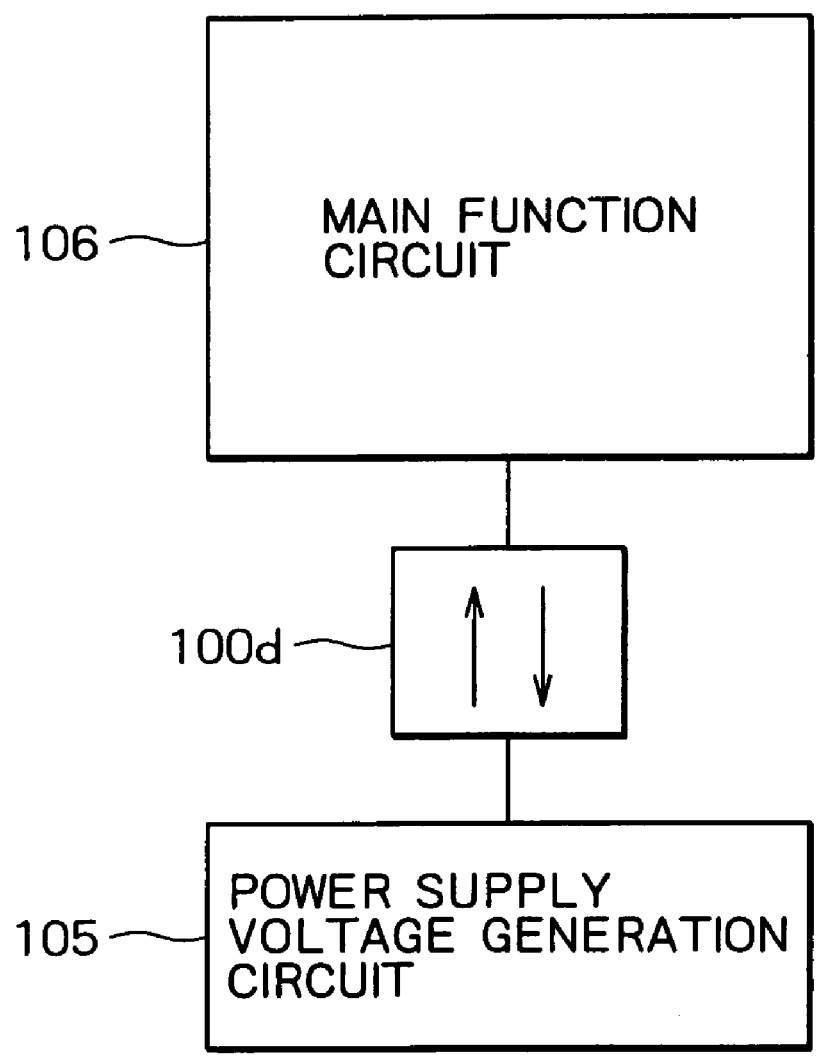
FIG. 10 is a schematic diagram showing the semiconductor circuit according to Embodiment 1 of the present invention.
Figure 11A:
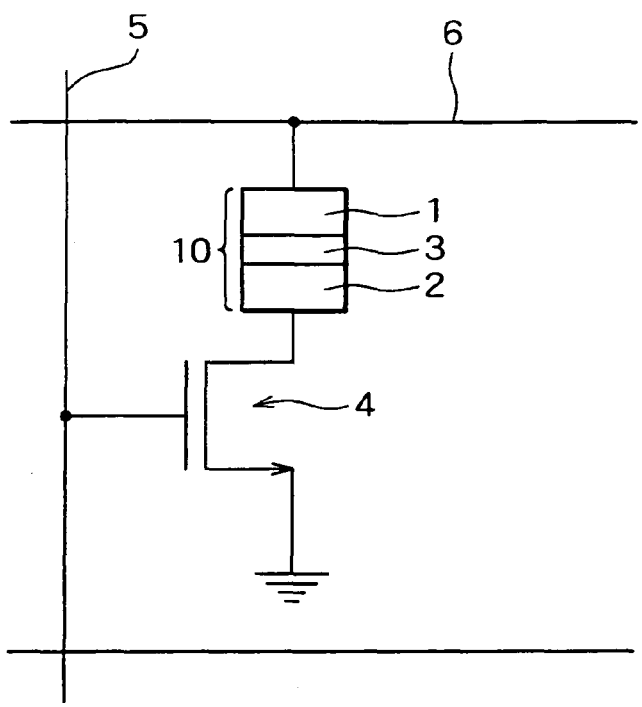
FIG. 11A is a schematic diagram showing the typical memory cell structure of MRAM in which an MTJ is used.
Figure 11B:
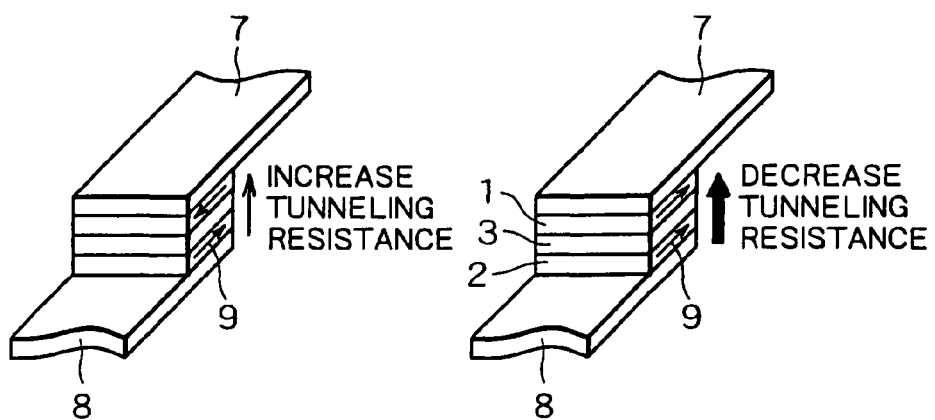
FIG. 11B is a schematic perspective view showing the operating principle of the same MTJ.
Figure 13A:
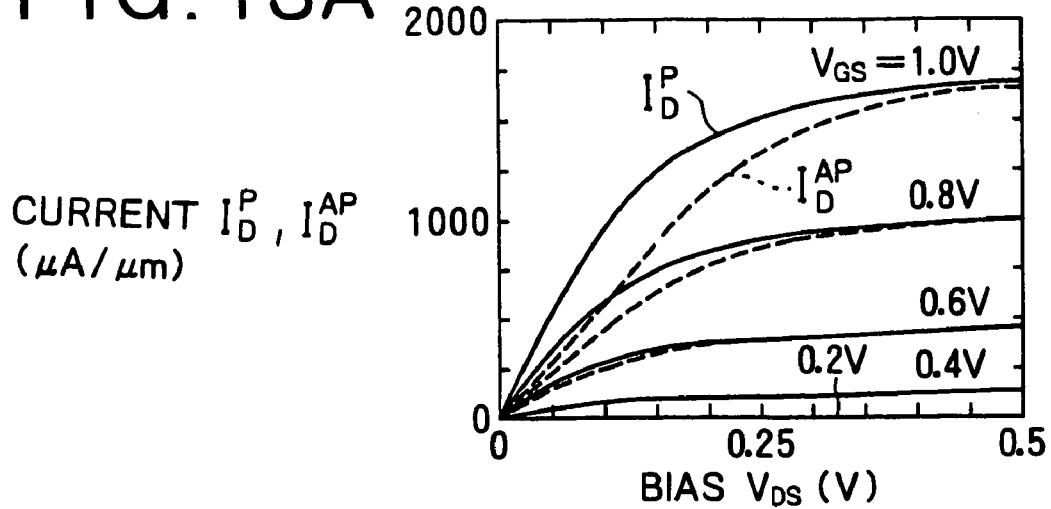
FIGS. 13A through 13C are graphs showing the output characteristics (static characteristics) of spin MOSFETs having the structures shown in FIGS. 12B through 12D, respectively.
Figure 13B:
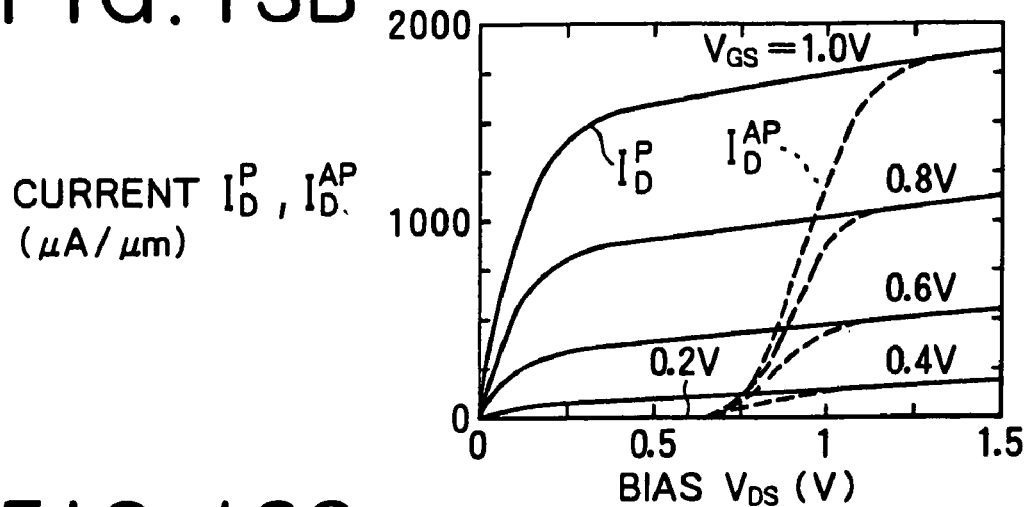
Figure 13C:
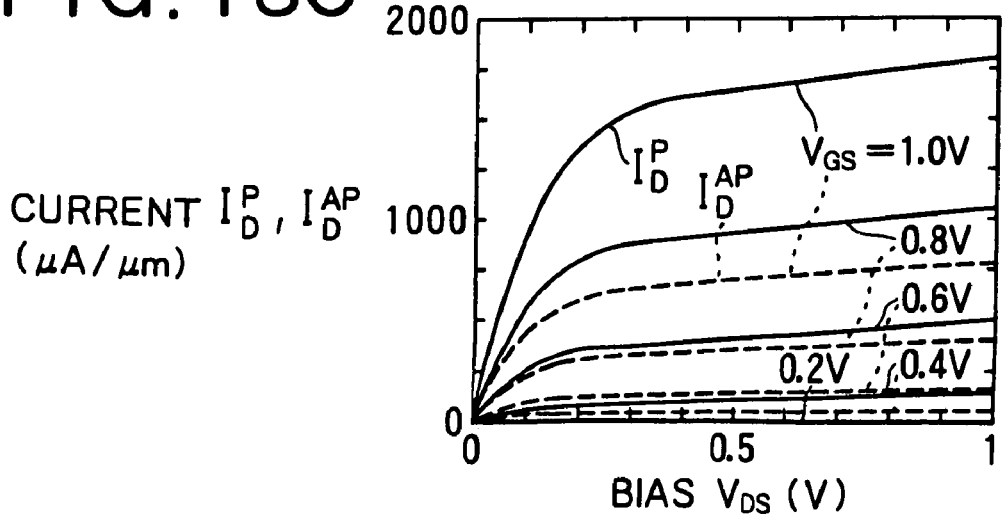
Figure 14A:
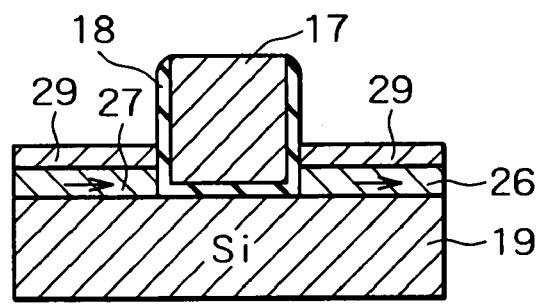
FIGS. 14A and 14B are schematic sectional views showing examples of the structure of a spin MOSFET in which HMF is used in the source and drain.
Figure 14B:
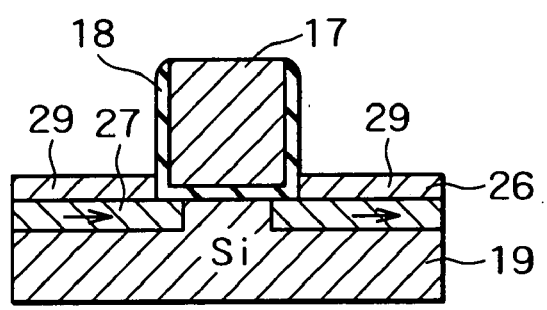
Figure 14C:
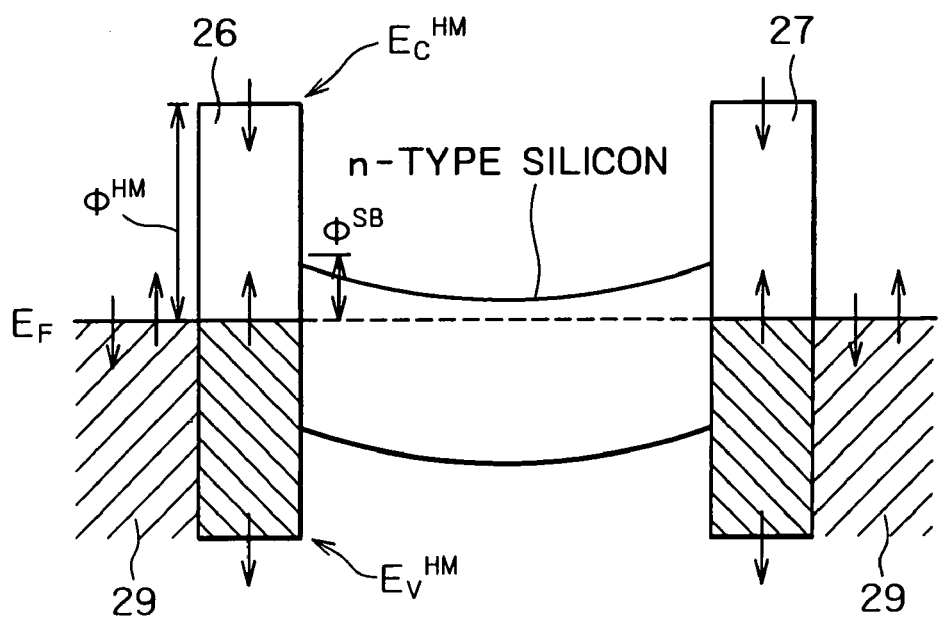
FIG. 14C is a schematic diagram showing a band diagram in the vicinity of the channel region of the MOSFET shown in FIGS. 14A and 14B.
Figure 15A:
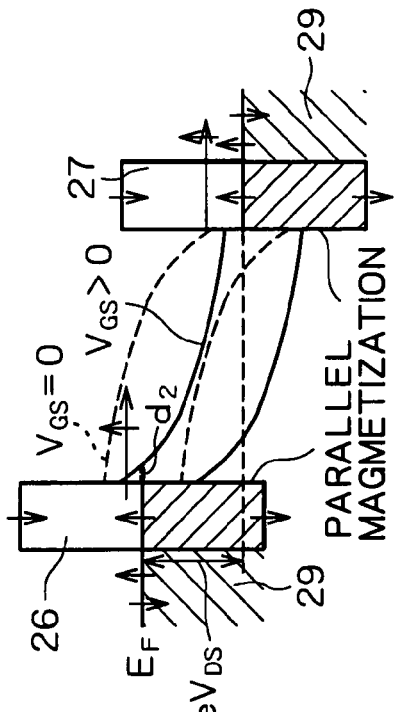
FIG. 15A is a schematic diagram showing a band diagram for a case in which the gate-source bias $V_{GS}$ of the spin MOSFET shown in FIGS. 14A and 14B is zero, and a bias $V_{DS}$ (>0) is applied between the drain and source.
Figure 15B:
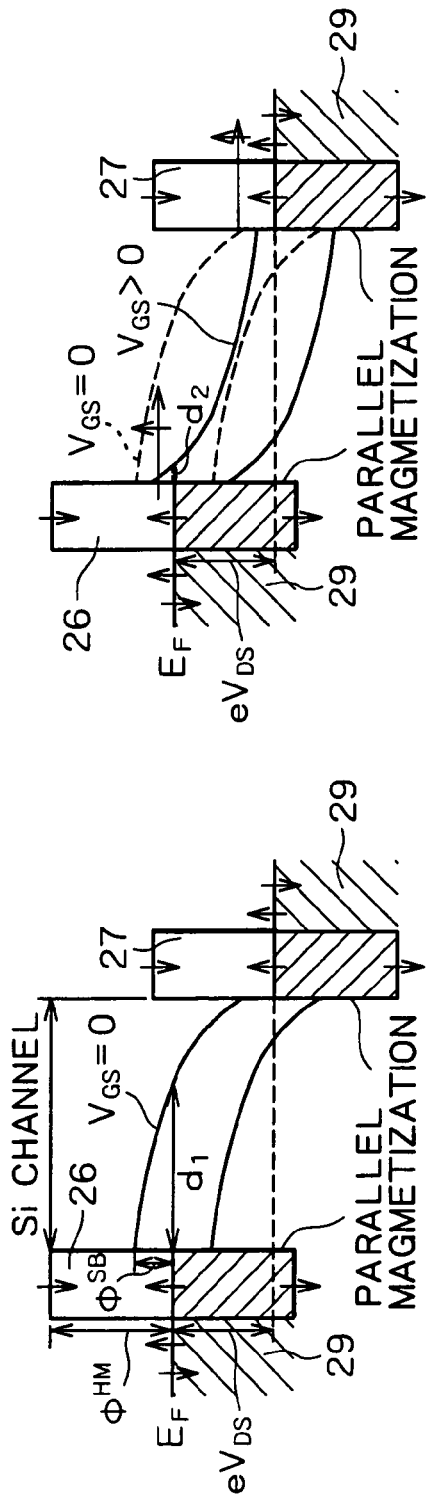
FIG. 15B is a schematic diagram showing a band diagram for a case in which $V_{GS}$ (>0) is applied in the state of FIG. 15A.
Figure 15C:
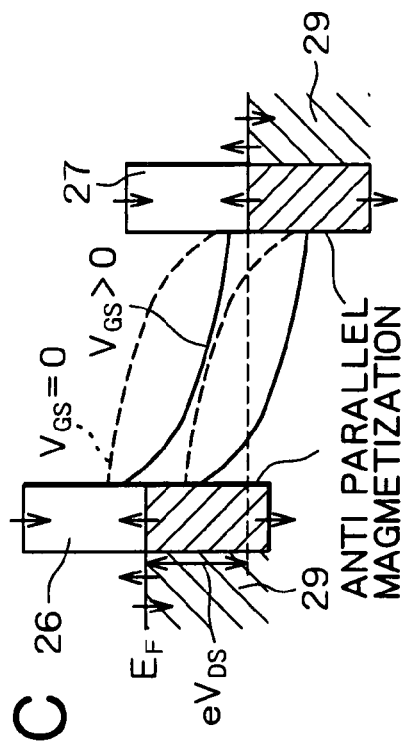
FIG. 15C is a schematic diagram showing a band diagram for a case in which the source and the drain are antiparallel magnetized.

Embodiments of the present invention will be described in detail below with reference to the attached diagrams. Embodiment 1 of the present invention will first be described. FIGS. 6 through 10 are schematic diagrams showing the semiconductor circuit according to the present embodiment. FIG. 11A is a schematic diagram showing the typical memory cell structure of MRAM in which an MTJ is used, and FIG. 11B is a schematic perspective view showing the operating principle of the same MTJ; FIGS. 12A through 12E are schematic diagrams showing examples of the structure of a spin MOSFET; FIGS. 13A through 13C are graphs showing the output characteristics (static characteristics) of spin MOSFETs having the structures shown in FIGS. 12B through 12D, respectively; FIGS. 14A and 14B are schematic sectional views showing examples of the structure of a spin MOSFET in which HMF is used in the source and drain, and FIG. 14C is a schematic diagram showing a band diagram in the vicinity of the channel region of the MOSFET shown in FIGS. 14A and 14B; FIG. 15A is a schematic diagram showing a band diagram for a case in which the gate-source bias $V_{GS}$ of the spin MOSFET shown in FIGS. 14A and 14B is zero, and a bias $V_{DS}$ (>0) is applied between the drain and source; FIG. 15B is a schematic diagram showing a band diagram for a case in which $V_{GS}$ (>0) is applied in the state of FIG. 15A; and FIG. 15C is a schematic diagram showing a band diagram for a case in which the source and the drain are antiparallel magnetized.

Figure 6:
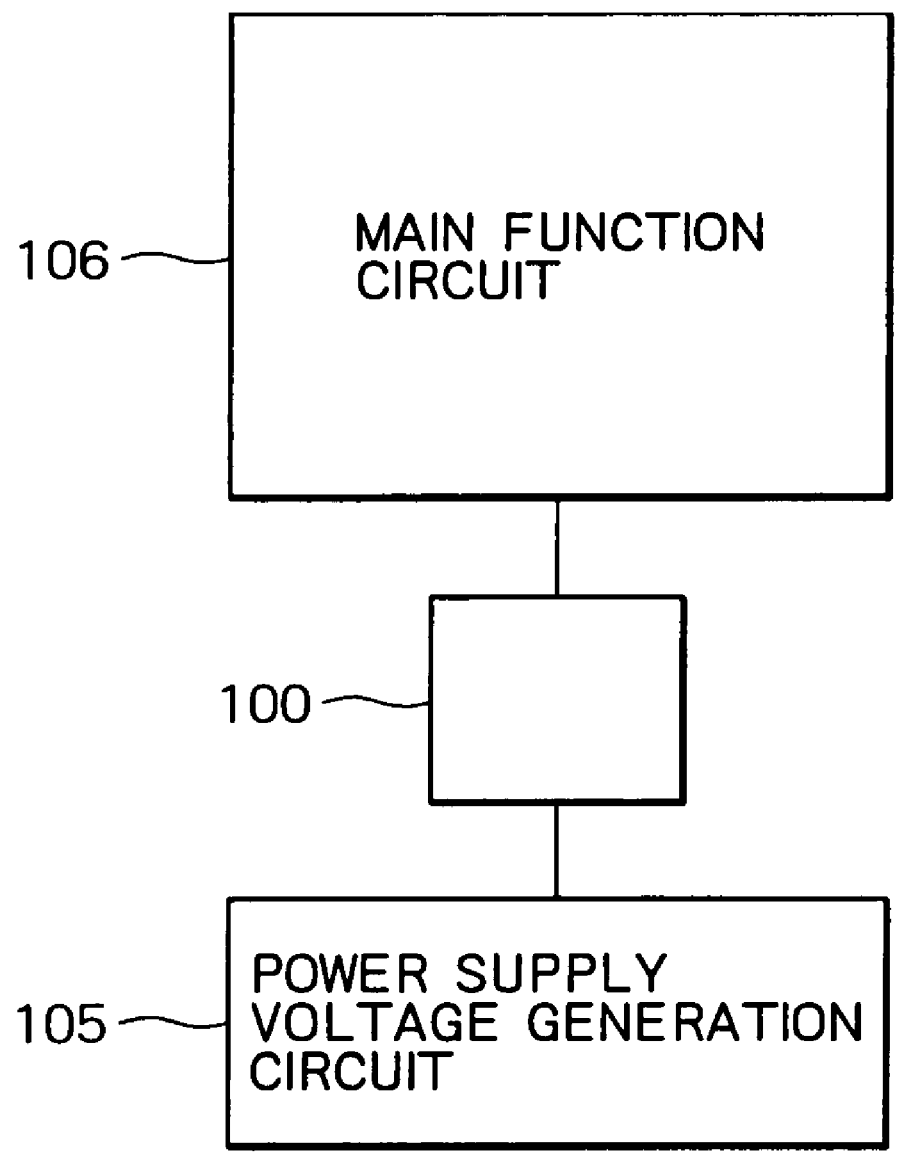
FIG. 6 is a schematic diagram showing the semiconductor circuit according to Embodiment 1 of the present invention.

As shown in FIG. 6, in the semiconductor circuit according to the present embodiment, a circuit 100 that utilizes the degree of freedom of an electron spin is provided as a second circuit between a power supply voltage generation circuit 105 and a main function circuit 106. The semiconductor circuit of the present embodiment is thereby formed.

A charge pump circuit, a level shift circuit, or the like may be used as the power supply voltage generation circuit 105. A regulator circuit may also be used as needed. The main function circuit 106 is a logic circuit, an analog circuit, or the like, and a desired main function is performed by a semiconductor circuit of the main function circuit 106.

For example, MRAM (Magnetoresistive Random Access Memory) can be cited as a device that utilizes the degree of freedom of an electron spin. As described in the prior art section of Japanese Laid-open Patent Application No. 2004-111904, the same operating speed and degree of integration as DRAM (Dynamic Random Access Memory) have recently been implemented in MRAM, and MRAM is receiving attention as next-generation memory that features non-volatility of data.

MRAM stores information according to the orientation of the magnetization of a ferromagnet, and the information that is stored according to this magnetic orientation is electrically read through the use of giant magnetoresistance in a spin valve element, tunneling magnetoresistance (TMR: Tunneling Magnetoresistance) in a magnetic tunnel junction (MTJ: Magnetic Tunnel Junction), or another effect. Nonvolatile storage of information by a ferromagnet can ideally be incorporated into semiconductor integrated electronics by the presence of an MTJ. Since MRAM stores information according to the orientation of the magnetization of a ferromagnet, information can be retained in nonvolatile fashion without expending energy.

As shown in FIG. 11A, a 1-bit memory cell of MRAM is formed by a single MTJ 10 and a single MOS (Metal Oxide Semiconductor) transistor 4. The MTJ 10 is structured so that an insulation film 3 is layered between a ferromagnetic electrode 1 and a ferromagnetic electrode 2. The gate of the MOS transistor 4 is connected to a reading word line 5, the source is grounded, the drain is connected to one terminal (ferromagnetic electrode 2) of the MTJ 10, and the other terminal of the MTJ 10 is connected to a bit line 6.

As shown in FIG. 11B, the MTJ 10 has a tunnel junction structure in which the thin-film insulation film 3 is sandwiched between the ferromagnetic electrode 1 and the ferromagnetic electrode 2, and the MTJ 10 has a TMR effect whereby the tunnel resistance varies according to the relative magnetic orientation 9 between the ferromagnetic electrode 1 and the ferromagnetic electrode 2. In particular, the rate of change in the TMR in a case of antiparallel magnetization and in a case of parallel magnetization between the ferromagnetic electrode 1 and the ferromagnetic electrode 2 is referred to as the TRM ratio, and the TRM ratio is used to evaluate the TRM effects.

In MRAM, information is stored by changing the magnetization state of the MTJ 10, i.e., the relative magnetic orientation 9 between the ferromagnetic electrode 1 and the ferromagnetic electrode 2, to parallel magnetization or antiparallel magnetization according to a combined magnetic field that is induced by currents that flow through the bit line 6 and a rewriting word line (not shown) that extends orthogonal to the bit line 6.

When stored information in a specific cell is read, a voltage is applied to a specific reading word line 5 that is connected to the cell, the voltage is conducted through the MOS transistor 4, a reading current (drive current) is caused to flow to the MTJ 10 from a specific bit line 6 connected to the cell, and the voltage drop of the MTJ 10 based on the TMR effect is detected as an output voltage. The information stored in a specific cell can thereby be read.

Figure 1:
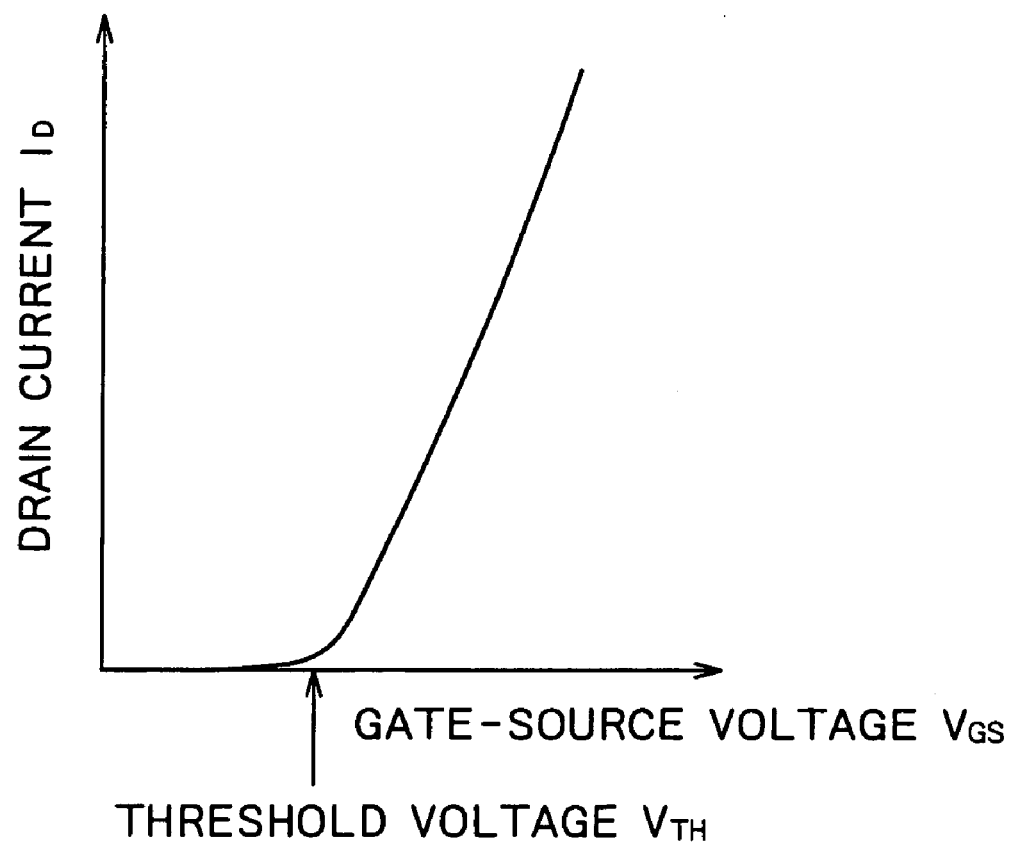
FIG. 1 is a diagram showing the conceptual definition of the threshold voltage $V_{TH}$ of a field-effect transistor.
Figure 2A:
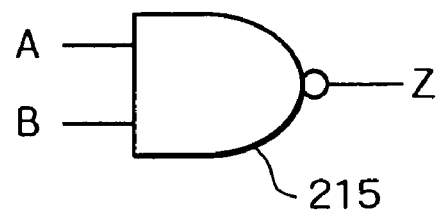
FIG. 2A shows a gate-level circuit symbol of a two-input NAND gate to which a power switch is not provided.
Figure 2B:
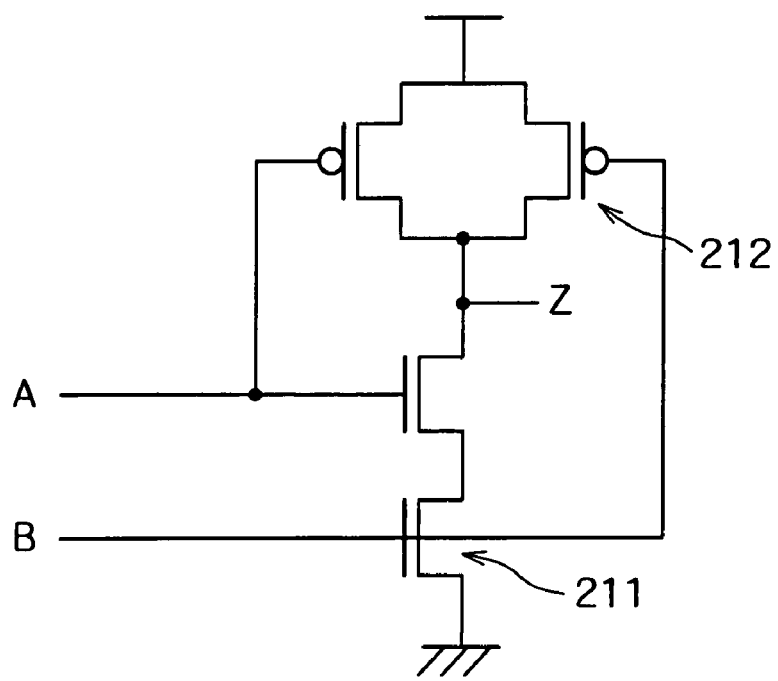
FIG. 2B is a circuit diagram showing the gate shown in FIG. 2A at the transistor level.
Figure 3A:
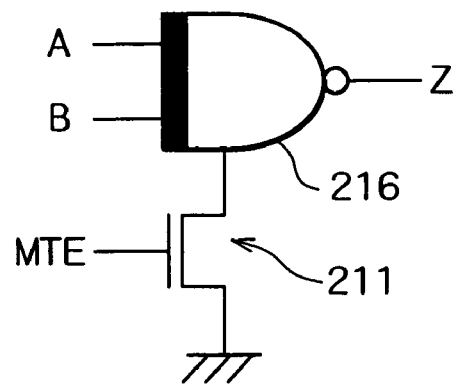
FIG. 3A shows a gate-level circuit symbol of a two-input NAND gate to which a power switch is provided.
Figure 3B:
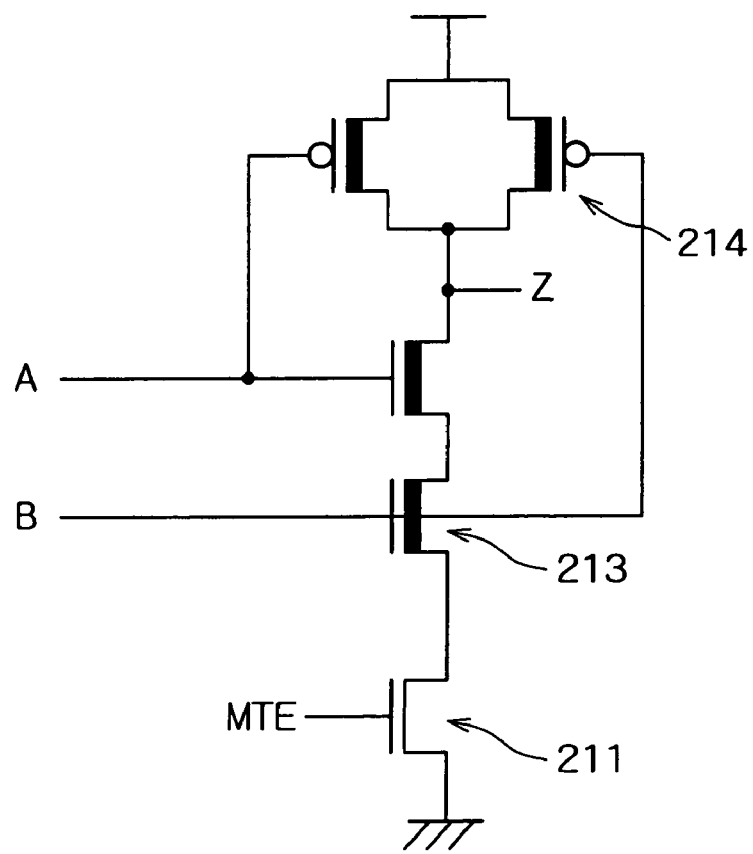
FIG. 3B is a circuit diagram showing the gate shown in FIG. 3A at the transistor level.
Figure 4:
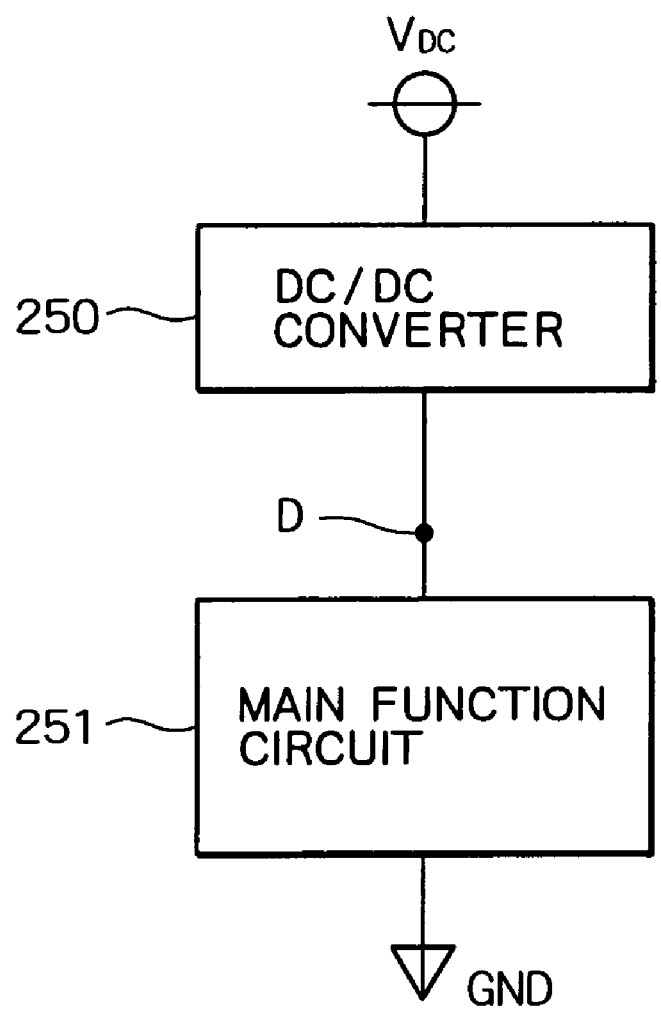
FIG. 4 is a schematic diagram showing the conventional DVS technique.
Figure 5:
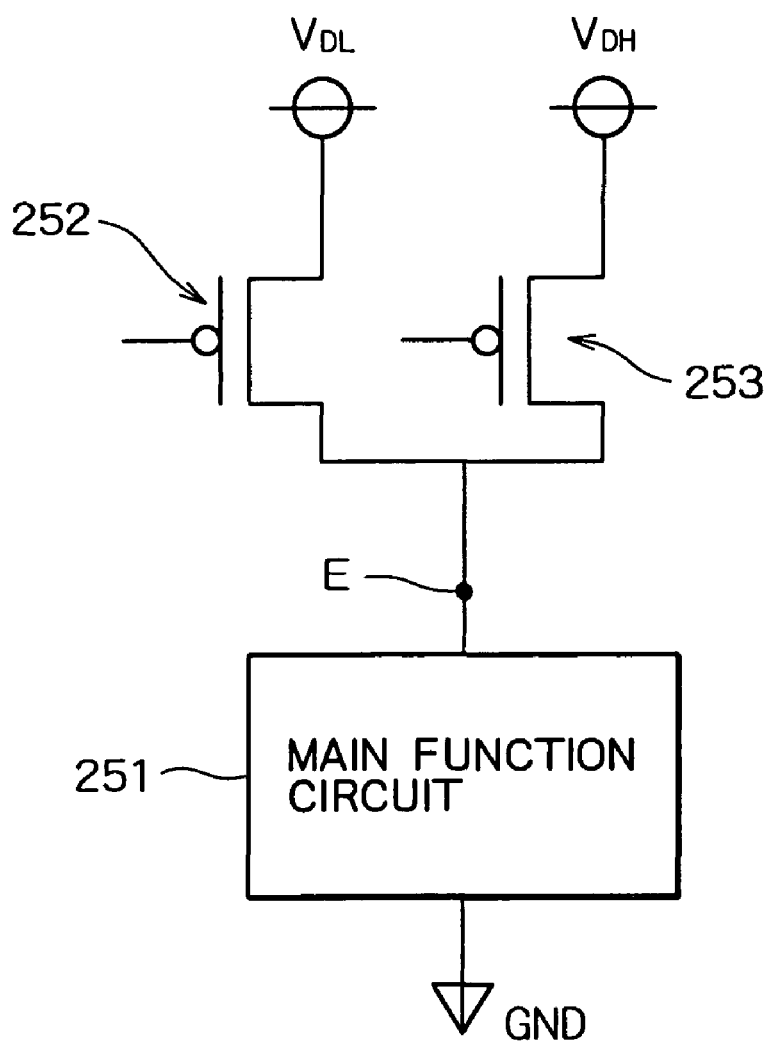
FIG. 5 is a schematic diagram showing the conventional $V_{DD}$-hopping technique.

Besides MRAM, a spin transistor is an example of utilizing the degree of freedom of an electron spin in semiconductor integrated electronics. Among spin transistors, the MOSFET spin transistors (hereinafter referred to as "spin MOSFET") disclosed in Japanese Laid-open Patent Application No. 2004-111904, Sugahara, S. "Ferromagnet/semiconductor hybrid devices using epitaxial ferromagnetic tunnel junctions-Creation of group IV ferromagnetic semiconductors and application thereof to spin devices," Japan Science and Technology Agency: Promoting basic research in prioritized research fields-Individual Research (aka: "sakigake") First Class: Results Report (pp. 48-50, FIGS. 5 and 6), and other publications have high compatibility with current silicon MOSFET-centered semiconductor integrated electronics.

A spin MOSFET has a source composed of a ferromagnet (hereinafter referred to as a ferromagnetic source), a drain composed of a ferromagnet (hereinafter referred to as a ferromagnetic drain), and a gate, and like a conventional MOSFET, is capable of utilizing the degree of freedom of an electron charge, and utilizing the degree of freedom of an electron spin to adjust the spin state in the source region and the drain region. Specifically, a spin MOSFET is a transistor that has a spin injector in which a spin polarized hot carrier is injected in a channel through a spin filter effect, and a spin detector for selecting the injected spin polarized hot carrier by the spin filter effect. The spin injector corresponds to the source, and the spin detector corresponds to the drain. The spin polarized hot carrier is selectively transported or blocked from the source according to the change in the spin state of the drain. The output characteristics of a MOSFET change according to the magnetization state of the ferromagnetic source and the ferromagnetic drain (or channel).

In the present embodiment, a spin MOSFET unit is used as the circuit 100 in which the degree of freedom of an electron spin is utilized, and the spin MOSFET used is the same as the spin MOSFET 110 of Embodiment 4 described hereinafter.

In the present embodiment, the circuit 100 in which the degree of freedom of an electron spin is utilized has a structure in which the channel region (channel 19) is a semiconductor (silicon in the example shown), the source 26 and the drain 27 are half-metallic ferromagnets (HMF: Half-metallic Ferromagnet), and the source-drains are Schottky junctions between the semiconductor and the HMF, the same as in the spin MOSFET shown in FIG. 12C. The HMF is a specialized ferromagnet in which one spin band has a metallic band structure, whereas the other spin band has an insulator (semiconductor) band structure.

In the present embodiment, the circuit 100 that utilizes the degree of freedom of an electron spin may have the structure shown in FIG. 14A or 14B, for example. The circuit 100 (spin MOSFET 110) that utilizes the degree of freedom of an electron spin shown in FIG. 14A is formed from a MOS structure composed of a gate electrode 17, a gate insulation film 18, and a semiconductor 19 in the same manner as a normal MOSFET, the source 26 composed of an HMF, and the drain 27 composed of an HMF. The structure shown in FIG. 14A is formed by doping an Si layer with a magnetic element to form the source 26 and the drain 27 composed of an HMF. The structure of the spin MOSFET shown in FIG. 14B is formed by utilizing the side walls or the like of the gate 17 to grow/deposit an HMF on the Si layer 19 and form the source 26 and the drain 27 composed of the HMF. It is assumed that a non-magnetic (NM: Nonmagnetic) contact 29 is formed on the HMF in these spin MOSFETs.

As described above, the HMF is a specialized ferromagnet in which one spin band has a metallic band structure, whereas the other spin band has an insulator (semiconductor) band structure. Accordingly, the Fermi energy traverses the metallic band of one of the spins and traverses in the band gap for the other spin, and only the spin belonging to the metallic band participates in carrier conduction. In the MOSFET shown in FIGS. 14A and 14B, the $E_F$ shown above the HMF source 26 and the HMF drain 27 is the Fermi energy, i.e., the Fermi surface of the metallic spin band, as shown in FIG. 14C. The symbols $E_C^{HM}$ and $E_V^{EM}$ shown above and below $E_F$ indicate the bottom of the conduction band of the insulator spin band, and the vertex of the insulator valence electron band, respectively.

When an accumulated n-channel spin MOSFET is formed using an HMF in the source and drain, a Schottky junction having a barrier height of $\phi^{SB}$ must be formed in the channel regions of the metallic spin band in the HMF and the n-type semiconductor layer (or genuine semiconductor layer). Through this junction, the conduction band bottom $E_C^{HM}$ of the insulator spin band in the HMF is an energy barrier of height $\phi^{HM}$ from the perspective of the Fermi energy $E_F$ of the NM contact 29 jointed to the HMF source 26 and the HMF drain 27.

Below is a description of the operating principle of the circuit 100 (spin MOSFET 110) that utilizes the degree of freedom of an electron spin so that the spin belonging to the metallic spin band of the HMF source 26 is an up spin, and the spin belonging to the semiconductor spin band is a down spin.

As shown in FIG. 15A, when the gate-source bias $V_{GS}$ is set to zero, and a bias $V_{DS}$ (>0) is applied between the drain and source, $V_{DS}$ is divided between the Schottky junction of the HMF source 26 and the Schottky junction of the HMF drain 27, and the Schottky junction of the HMF drain 27 is a forward bias, and the Schottky junction of the HMF source 26 is a back bias. At this time, the barrier width d (=$d_1$) of the Schottky junction of the HMF source 26 is sufficiently thick so that an up-spin electron from the metallic band of the HMF source 26 does not tunnel. Up-spin electrons of the HMF source 26 create a current equivalent to a backward saturation current in the Schottky junction by thermally overcoming the Schottky barrier, but the value of the current can be kept adequately small by appropriately selecting the Schottky barrier height $\phi^{SB}$. Accordingly, when $V_{GS}=0$, currents do not occur due to tunnel injection and thermal discharge of up-spin electrons even when the bias $V_{DS}$ (>0) is applied between the source and drain.

The energy gap of the insulator spin band of the HMF composed of down-spin electrons forms an energy barrier having a barrier height of $\phi^{HM}$ between the NM contacts 29 formed above the HMF. Since there are no conducted electrons in the insulator spin band of the HMF, down-spin electrons from the NM contacts 29 must tunnel through the insulator band of the HMF or thermally overcome the barrier in order for down-spin electrons to be injected into the channel region. At this time, down-spin electrons can be prevented from injecting into the channel region by setting an adequate film thickness for the HMF and setting the energy barrier $\phi^{HM}$ to an adequately large value in advance. The circuit 100 (spin MOSFET 110) that utilizes the degree of freedom of an electron spin is thereby placed in a blocked state in which there are no currents due to up-spin electrons and down-spin electrons even when the bias $V_{DS}$ (>0) is applied between the drain and source when $V_{GS}=0$.

When $V_{GS}$ (>0) is subsequently applied, the electric field in the vicinity of the Schottky barrier on the source side is strengthened by the electric power line extending toward the HMF source 26 from the gate electrode, and the Schottky barrier width d (=$d_2$) on the source side with respect to the metallic spin band is reduced, as shown in FIG. 15B. Accordingly, up-spin electrons tunnel through the Schottky barrier from the metallic spin band of the HMF, and are injected into the channel region directly below the gate insulation film. At this time, the down-spin electrons are not injected even when the Schottky barrier width d is reduced, due to the presence of the energy barrier having the barrier height $\phi^{HM}$ created by the insulator spin band of the HMF. Specifically, the HMF source 26 acts as a spin filter that injects only the electrons of the metallic spin band.

The up-spin electrons injected in the channel are transported to the Schottky barrier boundary on the drain side by the $V_{DS}$. When the HMF source 26 and the HMF drain 27 are parallel magnetized, the injected up-spin electrons are parallel to the spin of the metallic spin band of the HMF drain 27. At this time, since the metallic spin band acts as a contact for the channel, the up-spin electrons injected in the channel are conducted through the metallic spin band of the HMF drain 27, and become a drain current $I_D^P$.

As shown in FIG. 15C, when the HMF source 26 and the HMF drain 27 are antiparallel magnetized, the up-spin electrons injected in the channel are antiparallel aligned with the spin of the metallic band of the HMF drain 27, and are parallel to the spin of the insulator spin band. Accordingly, the HMF drain 27 acts as an energy barrier in which the barrier height $\Delta E_C = \phi^{HM} - \phi^{SB}$ with respect to the up-spin electrons. At this time, the amount of up-spin electrons that can pass through the HMF drain 27 can be ignored when the HMF film thickness of the HMF drain 27 and $\Delta E_C$ are selected so that the up-spin electrons do not tunnel through or thermally overcome the barrier. The HMF drain 27 thus has the effect of a spin filter that transmits only spins that are parallel to the spin of the metallic spin band, and does not transmit antiparallel spins.

It is apparent from the discussion above that the drain current $I_D^P$ is large when the source 26 and the drain 27 are parallel magnetized relative to each other, and the drain current $I_D^{AP}$ is extremely small when the source 26 and the drain 27 are antiparallel magnetized relative to each other in the circuit 100 (spin MOSFET 110) that utilizes the degree of freedom of an electron spin. Specifically, the circuit 100 has the output characteristics (static characteristics) shown in FIG. 13B. The drain current $I_D^P$ when the source 26 and the drain 27 are parallel magnetized is indicated by a solid line, and the drain current $I_D^{AP}$ when the source 26 and the drain 27 are antiparallel magnetized is indicated by a dashed line. In the output characteristics shown in FIGS. 13A through 13C, ballistic conduction of carriers is assumed, and the channel length is assumed to be adequately shorter than the spin relaxation distance.

The magneto-current ratio $\gamma_{MC}$ indicated by the equation below is introduced in order to evaluate the spin-dependent transport characteristics of the MOSFET.

$$\gamma_{MC}=(I_D^P-I_D^{AP})/I_D^{AP} \quad \text{[Equation 1]}$$

The drain current $I_D^P$ when the source 26 and the drain 27 are parallel magnetized increases nonlinearly according to $V_{GS}$. The value of the drain current $I_D^P$ increases as the value of $V_{DS}$ increases, but the increase in the drain current $I_D^P$ is small and gradual as the value of $V_{DS}$ increases. The reason for this is that the Schottky barrier width d on the source 26 side can be controlled by $V_{GS}$, and the Schottky barrier width d is substantially determined by $V_{GS}$, and is virtually independent of $V_{DS}$. When the source 26 and the drain 27 are antiparallel magnetized, there is almost no drain current $I_D^{AP}$ when $V_{DS}$ is about 0.7 V or less, and spin-dependent transport characteristics are obtained. From the vicinity of $V_{DS}$=0.7 V, up-spin electrons that are tunnel-injected from the source 26 are conducted through the channel in ballistic fashion, and can overcome the energy barrier of height $\Delta E_C = \phi^{HM} - \phi^{SB}$ created by the insulator spin band in the drain 27, and the drain current $I_D^{AP}$ therefore sharply increases.

As described above, the HMF of the source 26 and the drain 27 works as a spin filter that conducts only carriers that have a parallel spin to the metallic spin band. Accordingly, when the source 26 and the drain 27 are parallel magnetized, a large drain current $I_D^P$ can be obtained from the carriers that have a parallel spin to the metallic spin band. When the source 26 and the drain 27 are antiparallel magnetized, the metallic spin band of the source and the metallic spin band of the drain are antiparallel to each other, and almost no drain current $I_D^{AP}$ occurs. An extremely large $\gamma_{MC}$ can therefore be obtained. When carriers are conducted through the channel in ballistic fashion, the region of the drain bias $V_{DS}$ whereby such a large $\gamma_{MC}$ can be obtained is determined by the size of the band gap of the insulator spin band.

The circuit 100 that utilizes the degree of freedom of an electron spin can thereby switch the drain-source voltage for initiating an increase in the drain current by switching the spin states of the source 26 and the drain 27 between antiparallel magnetization and parallel magnetization.

Figure 7:
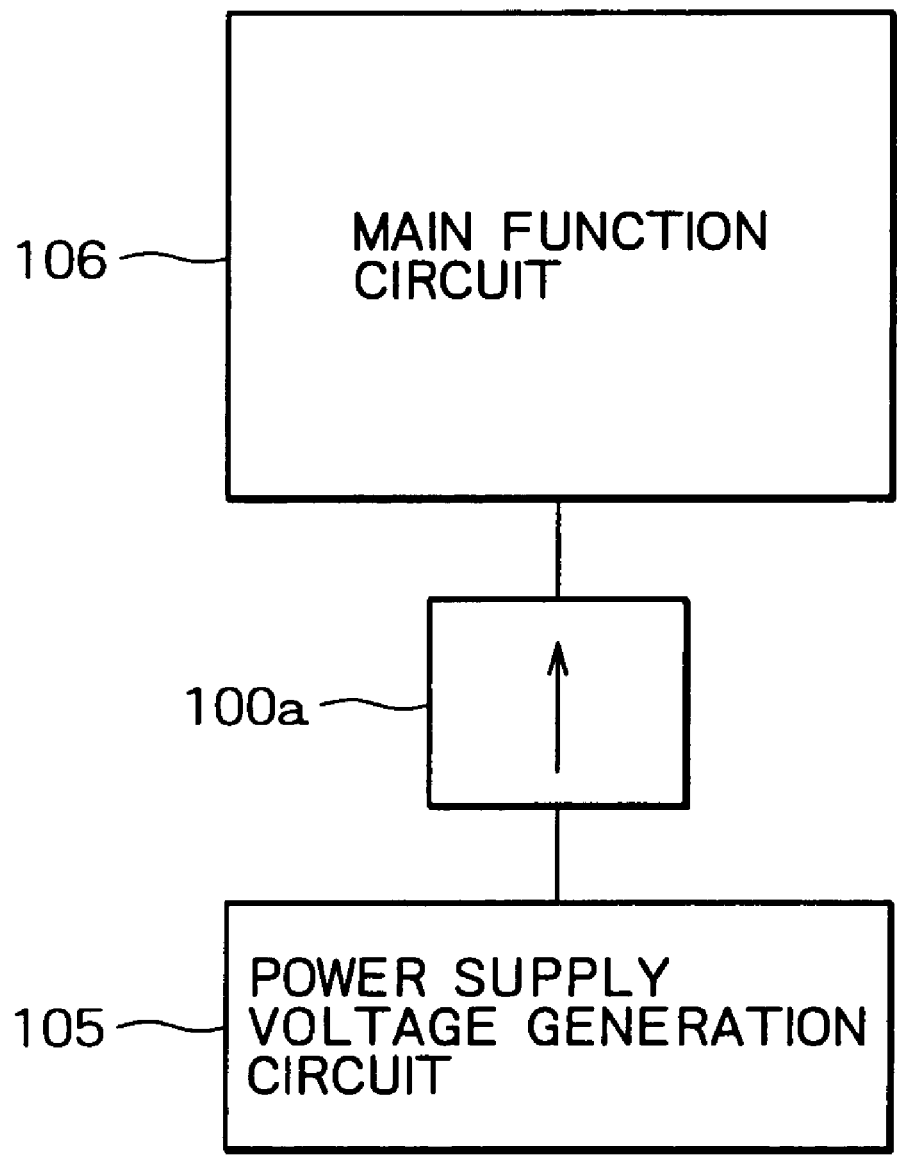
FIG. 7 is a schematic diagram showing the semiconductor circuit according to Embodiment 1 of the present invention.
Figure 8:
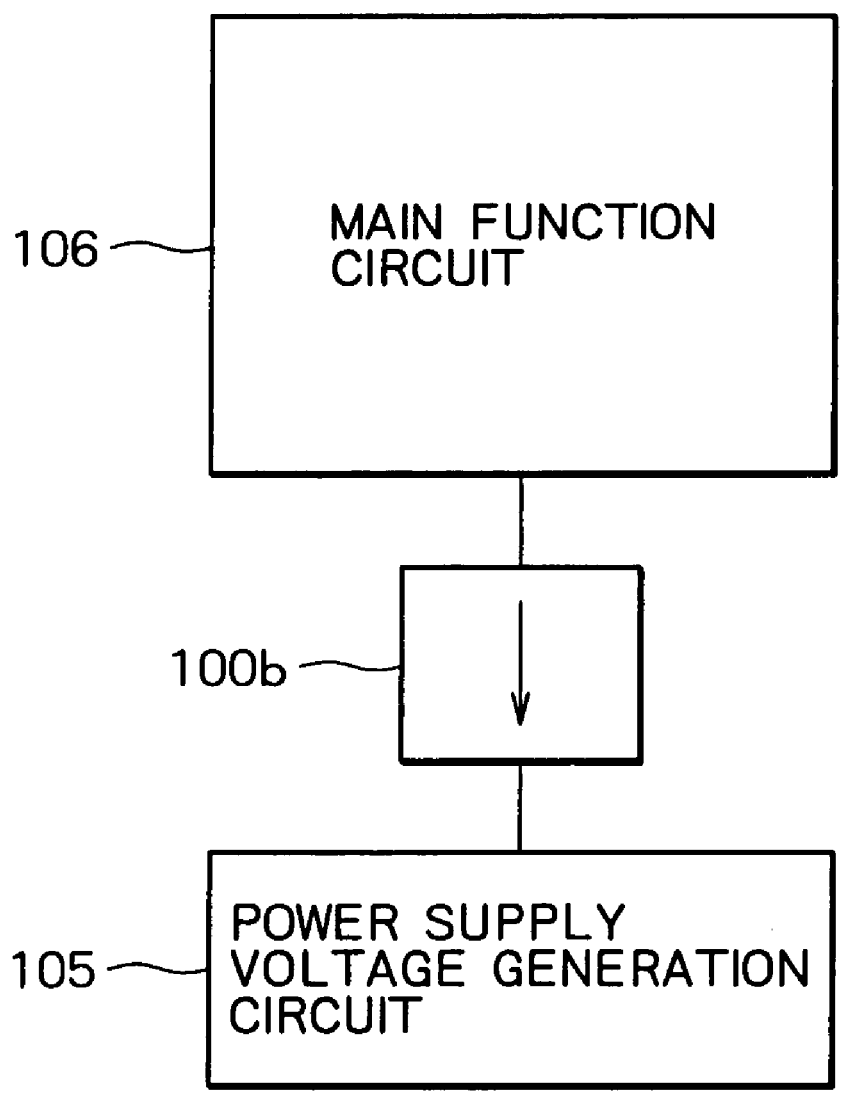
FIG. 8 is a schematic diagram showing the semiconductor circuit according to Embodiment 1 of the present invention.

For example, the state of the electron spin of the source 26 and the drain 27 of the circuit 100 that utilizes the degree of freedom of an electron spin can be adjusted to an up spin to create an up-spin circuit 100a as shown in FIG. 7. The state of the electron spin of the source 26 and the drain 27 of the circuit 100 that utilizes the degree of freedom of an electron spin can also be adjusted to a down spin to create a down-spin circuit 100b as shown in FIG. 8. At this time, since the electron spin of the source 26 and the drain 27 of the circuit 100 that utilizes the degree of freedom of an electron spin is in a parallel magnetization state, the circuit can be referred to as a parallel magnetized circuit 100c, as shown in FIG. 9. Changing the spin state of any one of the source 26 and the drain 27 for which the spin state is adjustable creates the antiparallel magnetization state in which the spins of the source 26 and the drain 27 are antiparallel to each other, and the circuit can be referred to as an antiparallel magnetized circuit 10d, as shown in FIG. 10.

In the example shown in FIG. 13B, when the source 26 and the drain 27 are parallel magnetized, the drain current $I_D^P$ increases when the drain-source voltage exceeds 0 V. However, when the source 26 and the drain 27 are antiparallel magnetized, there is a threshold voltage of about 0.7 V for the drain-source voltage, and the drain current $I_D^{AP}$ increases when 0.7 V is exceeded.

Specifically, in the semiconductor circuit of the present embodiment, when the threshold voltage for the drain-source voltage of the circuit 100 that utilizes the degree of freedom of an electron spin is 0 V (when the source 26 and the drain 27 shown in FIG. 13B are parallel magnetized), the main function circuit 106 operates normally when a voltage that exceeds the gate voltage threshold value is applied to the gate.

When a drain-source voltage that exceeds the threshold voltage is not applied in a state in which the absolute value of the threshold voltage for the drain-source voltage is larger than 0 V (when the source 26 and the drain 27 shown in FIG. 13B are antiparallel magnetized) the drain current $I_D^{AP}$ does not flow in the circuit 100 (spin MOSFET 110) that utilizes the degree of freedom of an electron spin even when a voltage that exceeds the threshold value of the gate voltage is applied, and the main function circuit 106 therefore does not operate.

The operation of the semiconductor circuit according to the present embodiment thus configured will next be described. In the semiconductor circuit according to the present embodiment, the state of the electron spin of the source 26 and the drain 27 of the circuit 100 that utilizes the degree of freedom of an electron spin can be adjusted to an up spin, for example, to create the up-spin circuit 100a as shown in FIG. 7. At this time, the spins of the source 26 and the drain 27 are adjusted to an up spin in a state of parallel magnetization, and the parallel magnetized circuit 100c as shown in FIG. 9 is therefore also created. As shown in FIG. 13B, there is no threshold voltage for the drain-source voltage at this time (the voltage would be in the vicinity of 0 V even if defined), and the drain current $I_D^P$ flows when a voltage that exceeds the gate voltage threshold is applied to the gate, and a voltage is applied between the drain and the source.

When the spin state of any one of the source 26 and the drain 27 for which the spin state is adjustable is changed so as to change the circuit 100 that utilizes the degree of freedom of an electron spin to the antiparallel magnetized circuit 100d in the antiparallel magnetization state in which the spins of the source 26 and the drain 27 are antiparallel to each other, the threshold value for the drain-source voltage is about 0.7 V, as shown in FIG. 13B, for example. At this time, even when a voltage that exceeds the gate voltage threshold value is applied to the gate, and a voltage is applied between the drain and the source, the drain current $I_D^P$ does not flow when the voltage applied between the drain and the source is lower than the threshold voltage, and the drain current $I_D^{AP}$ flows when the voltage is higher than the threshold voltage. In the circuit 100 that utilizes the degree of freedom of an electron spin, whether the drain current flows or does not flow can be adjusted in the case of certain drain-source voltages by adjusting the electron spin states of the ferromagnetic source and the ferromagnetic drain. A summary of this operation is shown below in Tables 1 and 2.

When there is no threshold value for the drain-source voltage (when the source 26 and the drain 27 are parallel magnetized), the drain current can be switched on and off according to the gate voltage, as shown in Table 1 below. Specifically, an on state occurs when the gate voltage is equal to or greater than the threshold value, and an off state (particularly a complete off state) occurs when the gate voltage is equal to or less than the threshold value.

TABLE 1

| gate voltage | equal to or greater than threshold value | drain current on |
|---|---|---|
| | equal to or less than threshold value | drain current completely off |

When there is a threshold value for the drain-source voltage (when the source 26 and the drain 27 are antiparallel magnetized), the on/off state of the drain current is controlled not only by the gate voltage, but also by the drain-source voltage, as shown in Table 2 below. As a result, the off state occurs when the gate voltage is above or below the threshold value in a state in which the drain-source voltage is equal to or less than the threshold value for the drain-source voltage (a complete off state occurs when the gate voltage is equal to or less than the threshold value). When the drain-source voltage is equal to or greater than the threshold value for the drain-source voltage, the on state occurs when the gate voltage is equal to or greater than the threshold value, and the off state occurs when the gate voltage is equal to or less than the threshold value.

TABLE 2

|  |  | drain-source voltage | |
| --- | --- | --- | --- |
|  |  | equal to or greater than drain threshold value | equal to or less than drain threshold value |
| gate voltage | equal to or greater than threshold value | drain current on | drain current off |
|  | equal to or less than threshold value | drain current off | drain current completely off |

The semiconductor circuit according to the present embodiment thus operates as described below. First, the power supply voltage generation circuit 105 and the main function circuit 106 are connected to each other in a spin state (the source 26 and the drain 27 are parallel magnetized) in which there is no threshold value for the drain-source voltage (the threshold voltage is near 0 V, and the main function circuit 106 operates normally. Specifically, whether the main function circuit 106 operates is determined by whether the gate voltage threshold value is exceeded. In a spin state (the source 26 and the drain 27 are antiparallel magnetized) in which there is a threshold value for the drain-source voltage, even when the gate voltage exceeds the threshold value, the power supply voltage generation circuit 105 and the main function circuit 106 are blocked from each other, and the main function circuit 106 does not operate when the drain-source voltage is smaller than the threshold voltage.

The operation or non-operation of the main function circuit 106 can thus be selected by adjusting the electron spin states of the source 26 and the drain 27 according to the present embodiment. In the past, the operating speed was adjusted, and the operation/non-operation of a main function circuit was selected by controlling the degree of freedom of an electron charge through such methods as adjusting the threshold value of the gate voltage. However, according to the present embodiment, the operation/non-operation of the main function circuit 106 can be selected by controlling the degree of freedom of an electron charge by controlling the degree of freedom of an electron spin.

The semiconductor circuit according to the present embodiment enables indirect control of the degree of freedom of an electron charge through control of the degree of freedom of an electron spin, as well as direct control of the degree of freedom of an electron charge through adjustment of the gate voltage and other methods. The operation/non-operation of the main function circuit 106 can therefore be selected by two or more methods.

In the semiconductor circuit according to the present embodiment, the main function circuit 106 can be placed in the operating state by applying a drain-source voltage that exceeds the threshold voltage even when there is a threshold value for the drain-source voltage according to the electron spin state. For example, by adjusting the potential supplied by the power supply voltage generation circuit 105 so that the drain-source voltage of the circuit 100 that utilizes the degree of freedom of an electron spin is higher than normal, the main function circuit 106 can be operated even when there is a threshold value for the drain-source voltage. The operation/non-operation of a circuit can thus be adjusted by a plurality of methods according to the present embodiment.

The circuit 100 that utilizes the degree of freedom of an electron spin was described in the present embodiment as the spin MOSFET unit shown in FIG. 12C, but this configuration is not limiting, and the circuit 100 that utilizes the degree of freedom of an electron spin may be partially formed by the spin MOSFET shown in FIG. 12C.

Embodiment 2 of the present invention will next be described. The circuit 100 that utilizes the degree of freedom of an electron spin as the second circuit in Embodiment 1 described above had a structure in which the channel 19 was a semiconductor, and the source 26 and the drain 27 were HMF, as shown in FIG. 12C. However, instead of the second circuit, the present embodiment has a first circuit in which the channel 28 is a ferromagnetic semiconductor (FS: Ferromagnetic Semiconductor), the source 23 and the drain 24 are ferromagnetic metals (FM: Ferromagnetic Metal), and the source-drains are Schottky junctions between the FS and the FM, as shown in FIG. 12D. Other structural aspects are the same as in Embodiment 1. In the present embodiment, since an FS is used in the channel 28 of the circuit 100 that utilizes the degree of freedom of an electron spin, a phenomenon referred to as field-effect magnetism control that is specific to an FS is utilized to electrically manipulate the magnetization state of the channel 28.

In the semiconductor circuit according to the present embodiment, the circuit 100 that utilizes the degree of freedom of an electron spin has the output characteristic (static characteristic) shown in FIG. 13C. As shown in FIG. 13C, the output characteristic when the source and the drain are antiparallel magnetized have a shape similar to the shape obtained by multiplying a constant n ($0 \leq n \leq 1$) by the output characteristic when the source and the drain are parallel magnetized. This output characteristic is highly dependent on the structure of the Schottky barrier created by the FS and the FM, but it is possible to obtain a $\gamma_{MC}$ that has almost no dependence on the bias throughout a wide range.

In the semiconductor circuit according to the present embodiment, the state of the electron spin of the source 23 and the drain 24 of the circuit 100 that utilizes the degree of freedom of an electron spin can be adjusted to an up spin to create an up-spin circuit 100a as shown in FIG. 7. The state of the electron spin of the source 23 and the drain 24 of the circuit 100 that utilizes the degree of freedom of an electron spin can also be adjusted to a down spin to create a down-spin circuit 100b as shown in FIG. 8. At this time, since the electron spin of the source 23 and the drain 24 of the circuit 100 that utilizes the degree of freedom of an electron spin is in a parallel magnetization state, the circuit can be referred to as a parallel magnetized circuit 100c, as shown in FIG. 9. Changing the spin state of any one of the source 23 and the drain 24 for which the spin state is adjustable creates the antiparallel magnetization state in which the spins of the source 23 and the drain 24 are antiparallel to each other, and the circuit can be referred to as an antiparallel magnetized circuit 10*d*, as shown in FIG. 10.

The operation of the semiconductor circuit according to the present embodiment will next be described.

In the semiconductor circuit according to the present embodiment, when the ferromagnetic source and the ferromagnetic drain of the circuit 100 that utilizes the degree of freedom of an electron spin are parallel magnetized as shown in FIG. 9, the drain current $I_D^P$ is large, as shown in FIG. 13C, and the operating speed of the main function circuit 106 increases when the drain current $I_D^P$ is large. This spin state can be utilized when high-speed operation of the main function circuit 106 is needed, and the frequency of operation is high. Even when the electron spin states of the ferromagnetic source and the ferromagnetic drain is the parallel magnetization state in the circuit 100 that utilizes the degree of freedom of an electron spin, the operating speed of the main function circuit 106 varies according to whether the up spin or the down spin is in effect.

The spins of the ferromagnetic source and the ferromagnetic drain of the circuit 100 that utilizes the degree of freedom of an electron spin can also be adjusted to the antiparallel magnetization state by changing the spin state of any one of the ferromagnetic source and the ferromagnetic drain for which the spin state is adjustable, to change to the antiparallel magnetized circuit 100*d* (FIG. 10). When the ferromagnetic source and the ferromagnetic drain are antiparallel magnetized as shown in FIG. 10, the drain current $I_D^P$ is small, as shown in FIG. 13C, and the operating speed of the main function circuit 106 decreases when the drain current $I_D^{AP}$ is small. An adjustment may thereby be made so that the ferromagnetic source and the ferromagnetic drain are antiparallel magnetized (FIG. 10) when lower power consumption is required, high-speed operation is not required, and the frequency of operation is low in the main function circuit 106. In the semiconductor circuit according to the present embodiment, the operating speed of the main function circuit 106 can be varied by varying the electron spin state.

Two or more modes that respectively correspond to two or more operating speeds can thus be selected by selecting the spin states of the source region and the drain region of the circuit 100 that utilizes the degree of freedom of an electron spin.

In the semiconductor circuit according to the present embodiment, the circuit 100 that utilizes the degree of freedom of an electron spin is a spin MOSFET in which the channel region is an FS, and the ferromagnetic source and the ferromagnetic drain are an FM, wherein the size of the drain current in the case of the same drain-source voltage is adjusted by adjusting the electron spin states of the ferromagnetic source and the ferromagnetic drain. The operating speed of the main function circuit 106 increases when the drain current is large. The operating speed of the main function circuit 106 decreases when the drain current is small, but power consumption also decreases. The operating speed and power consumption of the main function circuit 106 can thus be adjusted by adjusting the spin states of the source region and the drain region of the spin MOSFET. In the past, the operating speed and the power consumption of the main function circuit 106 were adjusted by controlling the degree of freedom of an electron charge through adjustment of the power supply voltage generation circuit 105 and other methods, but the present embodiment makes it possible to adjust the operating speed and the power consumption of the main function circuit 106 by controlling the degree of freedom of an electron spin. Furthermore, since the degree of freedom of an electron spin can be controlled, as well as the degree of freedom of an electron charge in the semiconductor circuit of the present embodiment, the operating speed and the power consumption of the main function circuit 106 can be adjusted by two or more methods.

The circuit 100 that utilizes the degree of freedom of an electron spin was described in the present embodiment as the spin MOSFET unit shown in FIG. 12D, but this configuration is not limiting, and the circuit 100 that utilizes the degree of freedom of an electron spin may be partially formed by the spin MOSFET shown in FIG. 12D.

Embodiment 3 of the present invention will next be described. In Embodiment 2 described above, the circuit 100 that utilizes the degree of freedom of an electron spin as the first circuit had a structure in which the channel 28 was an FS, and the source 23 and the drain 24 were an FM, as shown in FIG. 12D. However, in the present embodiment, a structure is adopted in which the channel 28 is an FS, the source 26 and the drain 27 are HMF, and the source-drains are Schottky junctions between the FS and the HMF, as shown in FIG. 12E. Other structural aspects are the same as in Embodiment 2.

Other configurations, operations, and effects of the semiconductor circuit of the present embodiment are the same as in Embodiment 2 described above.

In the semiconductor circuit according to Embodiments 1 through 3, the operating speed, the power consumption, and the operation/non-operation of the main function circuit can be dynamically adjusted. The electron spin state can thereby be varied, and the operating state of the circuit can be varied according to necessary operating conditions that are always changing.

A spin MOSFET can have various structures, as shown in FIGS. 12A through 12E.

In the example of a spin MOSFET structure shown in FIG. 12A, the channel region (channel 19) is a semiconductor (silicon in the example shown), the source 20 and the drain 21 are FS, and the source-drains are pn junctions between the semiconductor and the FS.

In the example of a spin MOSFET structure shown in FIG. 12B, the channel region (channel 19) is a semiconductor (silicon in the example shown), the source 23 and the drain 24 are FM, and the source-drains are Schottky junctions between the semiconductor and the FM.

The spin MOSFET is formed by substituting the source and drain or the channel region of a normal MOSFET with a ferromagnet. However, the source and drain of a spin MOSFET not only control the spin polarization current, but must also simultaneously satisfy the functions of a contact for the channel and a blocking contact for preventing an off current. Specifically, the source-drain junctions are capable of conducting a large spin polarization current through the application of a gate bias, and must also be junctions (contacts) whereby almost no current occurs when a gate bias is not applied. Such junction conditions as those shown in FIGS. 12A through 12E are therefore used.

As shown in FIG. 13A, in the output characteristic (static characteristic) of the spin MOSFET having the structure shown in FIG. 12B, the abovementioned $\gamma_{MC}$ is highly dependent on the drain bias $V_{DS}$ and the gate bias $V_{GS}$, and decreases as the $V_{DS}$ increases, but increases as the $V_{GS}$ increases. It is important that the spin polarizability of the FM be increased, and the height of the Schottky barrier reduced in order to increase $\gamma_{MC}$. However, the bias dependency of $\gamma_{MC}$ can impose limitations on implementation in an integrated circuit. A spin MOSFET having the structures shown in FIGS. 12C through 12E is thus used in the present invention, as described above in Embodiments 1 through 3.

Figure 16:
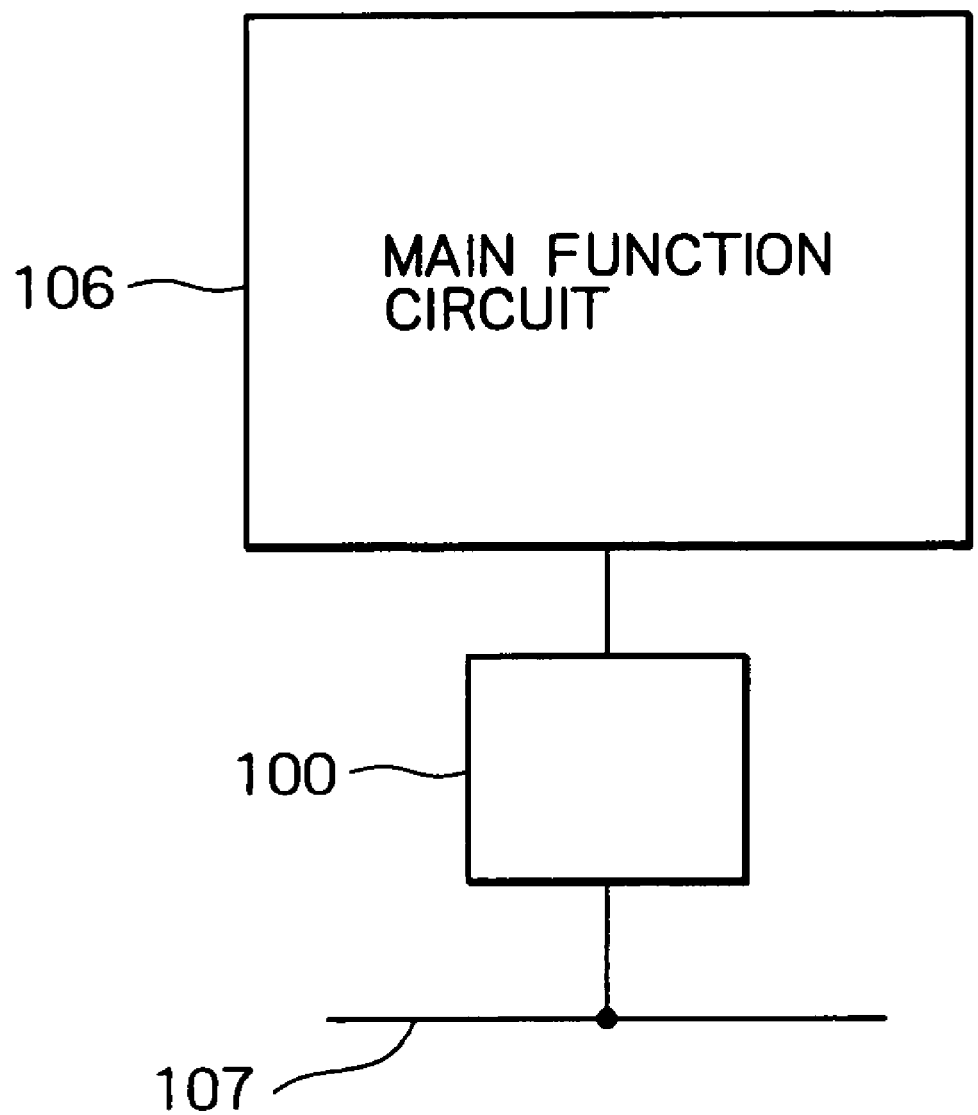
FIG. 16 is a schematic diagram showing the semiconductor circuit according to Embodiment 3 of the present invention.
Figure 17:
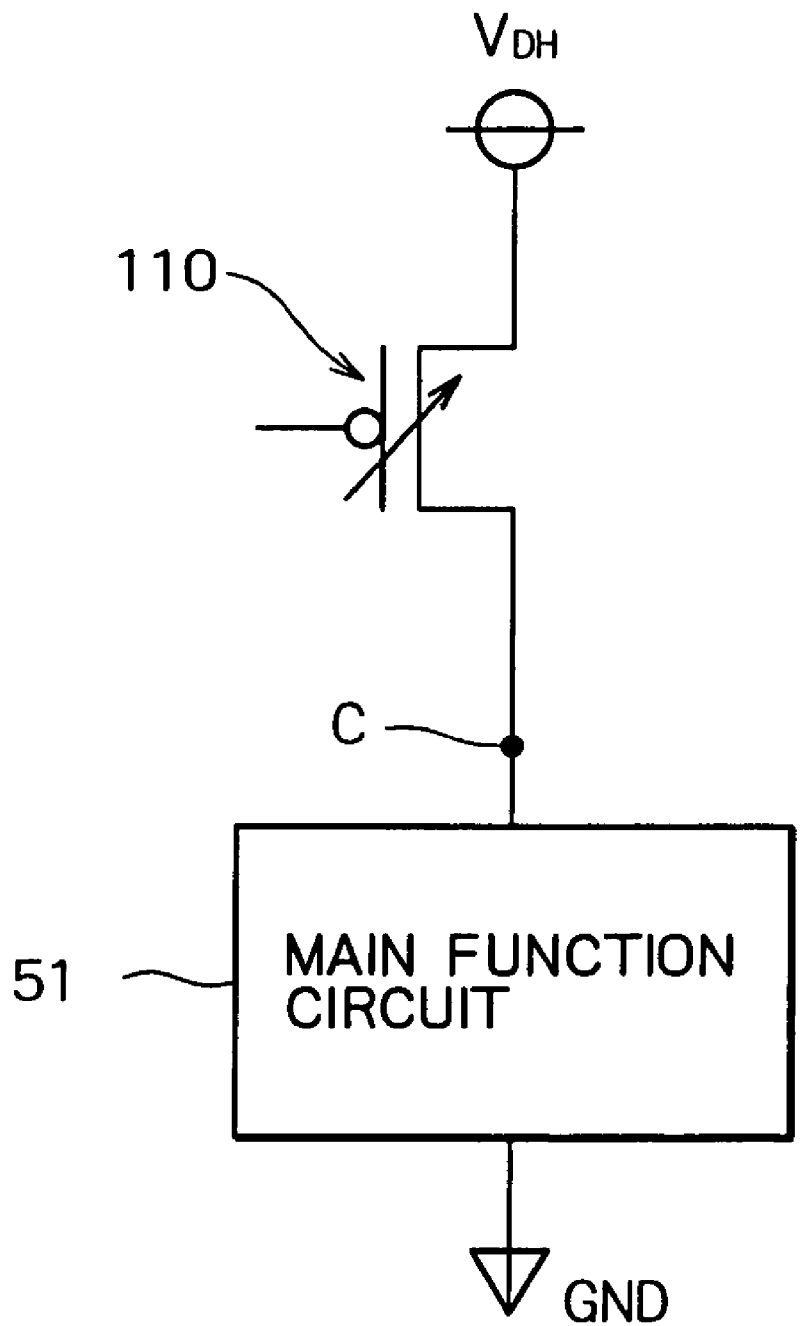
FIG. 17 is a schematic diagram showing an example of the semiconductor circuit according to Embodiment 3 of the present invention.

Embodiment 4 of the present invention will next be described. FIG. 16 is a schematic diagram showing the semiconductor circuit according to the present embodiment, and FIG. 17 is a schematic diagram showing an example of the semiconductor circuit according to the present embodiment. The same reference symbols are used in FIGS. 16 and 17 to indicate structural components that are the same as those in FIGS. 6 through 15, and no detailed description of these components will be given.

As shown in FIG. 16, in the semiconductor circuit of the present embodiment, the circuit 100 that utilizes the degree of freedom of an electron spin is disposed between a power supply line 107 and the main function circuit 106.

The circuit 100 that utilizes the degree of freedom of an electron spin may be a spin MOSFET unit, for example. In the present embodiment, the circuit 100 that utilizes the degree of freedom of an electron spin has a structure in which the channel region is a semiconductor (silicon in the example shown), the ferromagnetic source and the ferromagnetic drain are HMF, and the source-drains are Schottky junctions between the semiconductor and the HMF, as shown in FIG. 12C.

The operation of the semiconductor circuit according to the present embodiment thus configured will next be described. In the semiconductor circuit of the present embodiment, the voltage of the power supply line 107 is applied without modification to the main function circuit 106 when the electron spin states of the ferromagnetic source and the ferromagnetic drain of the circuit 100 that utilizes the degree of freedom of an electron spin are parallel magnetized, and there is no threshold value for the drain-source voltage, as shown in FIG. 13B. When the electron spin states of the ferromagnetic source and the ferromagnetic drain of the circuit 100 that utilizes the degree of freedom of an electron spin are antiparallel magnetized, and there is a threshold value for the voltage between the drain and the source, a voltage obtained by subtracting the threshold value of the drain-source voltage from the voltage of the power supply line 107 is applied to the main function circuit 106.

The circuit 100 that utilizes the degree of freedom of an electron spin was described in the present embodiment as the spin MOSFET unit shown in FIG. 12C, but this configuration is not limiting, and the circuit 100 that utilizes the degree of freedom of an electron spin may be partially formed by the spin MOSFET shown in FIG. 12C.

A transistor 110 unit that utilizes the degree of freedom of an electron spin is used as the circuit that utilizes the degree of freedom of an electron spin in the example of the semiconductor circuit of the present embodiment shown in FIG. 17. The transistor 110 has a structure in which the channel region is a semiconductor (silicon in the example shown), the ferromagnetic source and the ferromagnetic drain are HMF, and the source-drains are Schottky junctions between the semiconductor and the HMF, as shown in FIG. 12C, and it is possible to switch between states in which the drain-source voltage has or does not have a threshold value according to the spin states of the HMF source and the HMF drain.

In the example of the semiconductor circuit of the present embodiment shown in FIG. 17, the above-mentioned transistor 110 is disposed between the power supply voltage line and the main function circuit 106, and the power supply voltage is $V_{DH}$. The transistor 110 that utilizes the degree of freedom of an electron spin is a PMOS transistor in the example shown in FIG. 17, but this configuration is not limiting, and the same structure can be created using an NMOS transistor.

The example of the semiconductor circuit of the present embodiment shown in FIG. 17 can be compared with the conventional DVS technique and the conventional $V_{DD}$ hopping technique. FIG. 9 is a schematic diagram showing the conventional DVS technique, and FIG. 10 is a schematic diagram showing the conventional $V_{DD}$ hopping technique.

The DVS technique is a technique for adaptively varying the power supply voltage and the operating frequency according to the load of a circuit. As shown in FIG. 9, the power supply voltage $V_{DD}$ of a main function circuit 251 is changed to $V_{DL}$ or $V_{DH}$, for example, by a DC/DC converter 250 on the outside of the main function circuit 251, and the operating frequency f of the main function circuit 251 at the same time is varied by a clock circuit (not shown) inside the main function circuit 251.

In the $V_{DD}$ hopping technique, two types of power supply voltages $V_{DL}$ and $V_{DH}$, for example, are switched by PMOS transistors 252 and 253, as shown in FIG. 10.

In the example of the semiconductor circuit of the present embodiment shown in FIG. 17, the power supply voltage $V_{DH}$ is applied to point C when the electron spin states of the HMF source and the HMF drain are adjusted to parallel magnetization, i.e., when there is no threshold value for the drain-source voltage. The function is the same when $V_{DH}$ is generated by the DC/DC converter 250 in FIG. 9 and applied to point D, and when the PMOS transistor 253 of FIG. 10 is turned on, and $V_{DH}$ is applied to point E.

In FIG. 17, when the electron spin states of the HMF source and the HMF drain are adjusted to antiparallel magnetization, and there is a threshold value for the voltage between the drain and the source, a voltage obtained by subtracting the threshold value of the drain-source voltage from the power supply voltage $V_{DH}$ is applied to point C. Specifically, when the potential difference between the power supply voltage $V_{DH}$ and point C is equal to the drain-source voltage, the transistor 110 is turned off, and the voltage of point C does not reach the power supply voltage $V_{DH}$. The function is the same when $V_{DL}$ is generated by the DC/DC converter 250 in FIG. 9 and applied to point D, and when the PMOS transistor 252 in FIG. 10 is turned on, and $V_{DH}$ is applied to point E.

The semiconductor circuit according to the present embodiment achieves the same function as the conventional DVS technique and the conventional $V_{DD}$ hopping technique using a simpler circuit structure than the conventional DVS technique and the conventional $V_{DD}$ hopping technique.

The semiconductor device according to Embodiment 5 of the present invention will next be described. The semiconductor device of the present embodiment is provided with at least one of the semiconductor circuits according to Embodiments 1 through 4, and may be provided with numerous functional circuits, functional elements, and the like besides the semiconductor circuit according to Embodiments 1 through 4.

Embodiment 6 of the present invention will next be described. The present embodiment is an embodiment of the method for manufacturing a spin MOSFET that uses the semiconductor circuit and semiconductor device of the present invention.

When an FS is used in the channel part of a MOSFET spin transistor in the semiconductor circuit and the semiconductor device of the present invention, the FS may be grown directly or via a growth control layer on a semiconductor substrate, an insulation substrate, a metal substrate, or other support substrate, or the FS may be formed by introducing magnetic atoms through thermal diffusion, ion implantation, or the like. For example, manganese (Mn), chromium (Cr), or another transition metal element or rare earth element may be introduced into a semiconductor composed of silicon (Si), germanium (Ge), or a compound of these metals with another metal ($Si_xGe_{1-x}$, SiC, or the like, for example).

Iron (Fe), nickel (Ni), cobalt (Co), or another element, or an alloy containing at least one element selected from the group that includes iron (Fe), nickel (Ni), cobalt (Co), and chromium (Cr); a Permalloy (including iron-nickel alloy (Fe—Ni alloy), Supermalloy to which molybdenum (Mo) is added, Mumetal to which copper (Cu) or chromium (Cr) is added, and the like) cobalt-iron alloy (Co—Fe alloy: $Co_{1-x}Fe_x$), cobalt-iron-boron alloy (Co—Fe—B alloy: $Co_{1-x-y}Fe_xB_y$), and other common ferromagnetic metals may be used in the ferromagnetic source and the ferromagnetic drain. It is also possible to use $Co_2MnSi$ or another Heusler alloy, or $CrO_2$, $Fe_3O_4$ (magnetite), sphalerite CrAs, CrSb, MnAs, or $La_{1-x}Sr_xMnO_3$ and other half-metals. Furthermore, FS having a ferromagnetic metallic band structure, or FS having a half-metal band structure may be used.

The ferromagnetic source and the ferromagnetic drain may be formed by epitaxial growth or deposition of a ferromagnet on a non-magnetic semiconductor layer. Alternatively, the ferromagnetic source and the ferromagnetic drain may be formed by introducing a magnetic element into a non-magnetic semiconductor substrate by thermal diffusion, ion implantation, or another method.

The high-dielectric material $HfO_2$, or $SiO_2$, $Al_2O_3$, or the like may be used as the gate insulation film. The substrate may be a common semiconductor substrate or SOI substrate, or a glass substrate, quartz substrate, or other insulating substrate, or a substrate that uses metal or the like. The use of an SOI substrate or an insulating substrate is particularly advantageous for increasing the speed of the circuit, because the parasitic capacitance around the channel is significantly reduced.

The semiconductor circuit and the semiconductor device of the present invention can be fabricated by a common thin-film process and a common micro-fabrication process.

Pulse laser deposition (PLD) or ion beam deposition (IBD), for example, may be used as the thin-film formation process. Various types of sputtering methods (direct current (DC), high frequency (RF), magnetron, facing target, electron cyclotron resonance (ECR), helicon wave plasma, inductive coupling plasma (ICP), or cluster ion beam and other ion beams), molecular beam epitaxy (MBE), or ion plating methods and other various PVD methods may also be used. Various CVD methods (thermal CVD, optical CVD, plasma CVD, and the like) may also be used. Plating or a sol-gel method may also be used.

The micro-fabrication method may be a combination of a photolithography technique that uses a stepper, an electron beam (EB: Electron Beam) method, or the like to form a micro pattern with a semiconductor process, an ion milling method, a reactive ion etching (RIE: Reactive Ion Etching) method (particularly deep RIE), a focused ion beam (FIB: Focused Ion Beam) method, or another physical or chemical etching method, for example.

The magnetization states of the source and the drain may be written by various methods. Examples include a method for writing using a current-induced magnetic field, the same as in MRAM. A specific example is a so-called external magnetization reversal method whereby a current is applied to an electrode near the target for writing the magnetization state to generate an external magnetic flux from the current and change the spin orientation. Two or more electrodes are usually used at this time, and the magnetization is reversed by the magnetic field created by a combination of the external magnetic fluxes generated by the two electrodes, whereby write errors can be prevented, and the spin orientation can be reversed only in the prescribed site of the matrix.

The size of the portion in which the magnetization state is written decreases as the size of the device decreases. Therefore, when the device has a small size, there must be an adequately large magnetic charge in order to adequately maintain the written magnetization state. The necessary magnetic charge is extremely large particularly for nano sizes, and demagnetizing fields increase significantly. A large magnetic field is needed in order to reverse such a large magnetic charge, and the current for generating the necessary magnetic field at the nano size also significantly increases. Since the wiring is also reduced in size in a nano-sized device, melting and other problems can occur in the wiring when a large current is applied, and it is therefore difficult to apply large currents, and extremely difficult to generate the necessary magnetic field for writing from the current.

As described above, in a method that uses a current-induced magnetic field to write the magnetization state, the write current increases in substantially inverse proportion to the size of the target device. Therefore, when the device has a small size, the magnetization state is preferably written using a method other than writing using a current-induced magnetic field.

An example of a method that can be suitably applied when the device is small in size is a method for writing the magnetization state using spin injection magnetization reversal. Spin injection magnetization reversal is a method whereby a direct current is applied to the target portion where the magnetization state is written, and the magnetization state is reversed by the effects of electron spin. Specifically, in spin injection magnetization reversal, a spin polarization current is injected into the ferromagnet layer, whereby the spin polarization current generates the necessary torque to reverse the magnetization in the ferromagnet layer. More specifically, when the spin polarization current is injected into the ferromagnet, two effects occur that include a transfer of angular momentum (angular momentum transfer) of the spin, and spin accumulation whereby an electrochemical potential polarizes depending on the spin. These two types of effects cause a torque to act on a localized spin in the spin-injected ferromagnet, and such effects as nonequilibrium magnetization (internal magnetic flux) occur in the vicinity of the junction with the injection terminal. The magnetization of the ferromagnet can be reversed by these effects. The write current can be reduced by reduction of the device size in spin injection magnetization reversal. Since there is no problem of half selection in magnetic field writing, spin injection magnetization reversal is more promising than a current-induced magnetic field.

Since a spin MOSFET is a symmetric device in which the source and the drain are disposed opposite each other, a spin polarization current can be applied from the source side or the drain side. The magnetization state can thereby be rewritten from the source side or the drain side. Since the direction of the spin polarization current must be changed particularly when two values of magnetization states are rewritten, the spin MOSFET is preferably a symmetric device.

When the necessary current is large in the spin injection magnetization reversal method, the structure as such in the target portion is sometimes damaged by the large current. The use of a spin injection magnetization reversal method that has a small necessary current is therefore preferred. The channel length is also preferably shorter than the spin relaxation distance. Furthermore, the channel part is preferably a semiconductor when the spin injection magnetization reversal method is used.

Electric-field assisted magnetization reversal is also useful for writing the magnetization states for the source and the drain. In electric-field assisted magnetization reversal, a substance that is capable of adjusting coercive force by an electric field is used to reduce the coercive force by an electric field when magnetization is reversed, whereby the magnetization can be reversed by a small magnetic field. Since the magnetic field needed for magnetization reversal can be reduced by an electric field in electric-field assisted magnetization reversal, it is possible to reduce the magnetic field and the current that is needed to generate the magnetic field necessary for writing.

In a method that is extremely useful particularly when the channel part is a ferromagnet, the channel part is set to a paramagnetic state by an electric field, and the magnetization state is reversed by a small magnetic field, after which the magnetization state is written by removing the electric field to cause a return to the ferromagnetic state. This method takes advantage of the fact that the coercive force of the paramagnet state is significantly smaller than the coercive force of the ferromagnet state. The ferromagnetic state easily changes to the paramagnetic state particularly when an electric field is applied to an FS to reduce the carrier density of the channel part. Since the carrier density is reduced by application of an electric field, the carrier density returns to the original state when the electric field is removed, and a transition occurs from a paramagnet to a ferromagnet.

It is also possible to use a method for moving the magnetic domain wall using a spin polarization current to create a desired magnetization state in a desired position. However, when this method is used, the magnetic domain wall must be fixed in the desired position even after the spin polarization current is removed, and somewhat more structural design is required.

The present invention makes it possible to adjust the operating speed and power consumption of a main function circuit by adjusting the electron spin states of the source region and the drain region of a spin MOSFET.

A semiconductor circuit that has both low power consumption and high performance can also be obtained by dynamically adjusting the electron spin states of the source region and the drain region of the spin MOSFET.

Electrons in the channel part of the spin MOSFET used in the present invention are preferably conducted in ballistic fashion. Since there is minimal variation in the spin state of the spin polarization current when the conduction is ballistic, a highly efficient spin MOSFET can be obtained.

In the present invention, a spin MOSFET was described as an example of a FET in which the degree of freedom of an electron spin can be utilized to adjust the spin states of the source region and the drain region, but the same operations and effects can be obtained using a MISFET (Metal-Insulator-Semiconductor Field-Effect Transistor) having a wider range insofar as the MISFET has the same configuration as a MOSFET.

What is claimed is:

1. A semiconductor circuit comprising:
   a power supply voltage generation circuit;
   a second circuit comprising a transistor that is connected to the power supply voltage generation circuit, and that is capable of varying a drain threshold value, which is a drain-source voltage where a drain current starts flowing, by utilizing a degree of freedom of an electron spin to vary at least one of a spin state of a source and a spin state of a drain; and
   a main function circuit that comprises a main function and operates according to a drain current output from said second circuit,
   wherein an on-off state of the drain current for operating the main function circuit is determined based on a magnitude relation between the drain threshold value for the drain-source voltage of the transistor which is varied by varying said spin state and by varying a drain-source voltage applied to the transistor by the power supply voltage generation circuit, and a magnitude relation between a gate threshold value for a gate voltage of the transistor and a gate voltage applied to a gate of the transistor.

2. The semiconductor circuit according to claim 1, wherein said source and drain of said transistor comprise a ferromagnetic metal or a half-metallic ferromagnet, and
   wherein a channel region comprises a semiconductor.

3. The semiconductor circuit according to claim 1, wherein at least one of said spin state of the source and said spin state of the drain of said transistor are dynamically adjusted.

4. A semiconductor device that comprises the semiconductor circuit according to claim 1.

5. The semiconductor circuit according to claim 1, wherein the transistor comprises:
   a semiconductor substrate;
   a drain layer comprising a half-metallic ferromagnet disposed on the semiconductor substrate;
   a source layer comprising a half-metallic ferromagnet disposed on the semiconductor substrate;
   a non-magnetic contact disposed on the drain layer and the source layer;
   a gate insulation film formed on a portion of the semiconductor substrate; and
   a gate electrode formed on the gate insulation film.

6. The semiconductor circuit according to claim 5, wherein the semiconductor substrate is disposed between at least a portion of the drain layer and at least a portion of the source layer.

7. The semiconductor circuit according to claim 1, wherein the drain current for operating the main function circuit is in an on state when the applied drain-source voltage is equal to or greater than the drain threshold value and the applied gate voltage is equal to or greater than the gate threshold value.

8. The semiconductor circuit according to claim 1, wherein the drain current for operating the main function circuit is in an off state when the applied drain-source voltage is smaller than the drain threshold value even if the applied gate voltage is equal to or greater than the gate threshold value.

9. A semiconductor circuit comprising:
   a power supply voltage generation circuit;
   a second circuit comprising a transistor that is connected to the power supply voltage generation circuit, and that is capable of varying a drain threshold value, which is a drain-source voltage where a drain current starts flowing, by utilizing a degree of freedom of an electron spin to vary at least one of a spin state of a source and a spin state of a drain; and
   a main function circuit that comprises a main function and operates according to a drain current output from said second circuit,
   wherein an on-off state of the drain current for operating the main function circuit is configured to be controlled based on the spin state, a gate voltage of the transistor, and by varying the drain-source voltage applied to the transistor.

* * * * *